(12) United States Patent
Chiba

(10) Patent No.: US 8,619,449 B2
(45) Date of Patent: Dec. 31, 2013

(54) VOLTAGE CONVERTER

(75) Inventor: Hironori Chiba, Tokyo (JP)

(73) Assignee: TDK Corporation, Tokyo (JP)

( * ) Notice: Subject to any disclaimer, the term of this patent is extended or adjusted under 35 U.S.C. 154(b) by 474 days.

(21) Appl. No.: 13/051,525

(22) Filed: Mar. 18, 2011

(65) Prior Publication Data

US 2011/0234196 A1 Sep. 29, 2011

(30) Foreign Application Priority Data

Mar. 26, 2010 (JP) ................................ 2010-073129

(51) Int. Cl.
*H02M 1/00* (2007.01)
*H02H 7/10* (2006.01)

(52) U.S. Cl.
USPC ............................................ 363/147; 363/50

(58) Field of Classification Search
USPC ............ 363/50, 144, 147; 323/222, 223, 225, 323/268, 271; 257/296, 298, 299
See application file for complete search history.

(56) References Cited

U.S. PATENT DOCUMENTS

| 5,355,301 A * | 10/1994 | Saito et al. ..................... 363/147 |
| 2004/0140877 A1 | 7/2004 | Nakao et al. |
| 2011/0031952 A1* | 2/2011 | Nakamura ..................... 323/311 |
| 2012/0013316 A1* | 1/2012 | Nakamura et al. ............ 323/271 |

FOREIGN PATENT DOCUMENTS

JP A-2004-063676 2/2004

\* cited by examiner

*Primary Examiner* — Matthew Nguyen
(74) *Attorney, Agent, or Firm* — Oliff & Berridge, PLC

(57) ABSTRACT

There is provided a voltage converter capable of reliably preventing malfunctions of an electronic circuit to stably maintain an accurate operation by suppressing high-frequency noise generated on an input side. A DC-DC converter 1 as a voltage converter includes an active component embedded substrate 2 having an IC chip 7 and an input-side capacitor Cin and an output-side capacitor Cout mounted thereon, and ground layers 33G-1 and 33G-2 and a ground layer 32G are formed therein so as to interpose the IC chip 7 therebetween. The input-side capacitor Cin is connected to the ground layer 33G-1, and the output-side capacitor Cout is connected to the ground layer 33G-2. Moreover, the ground layer 32G is connected to the terminals of the IC chip 7, and the input-side capacitor Cin and the output-side capacitor Cout are connected to each other by the ground layers 33G-1 and 33G-2.

6 Claims, 20 Drawing Sheets

VOLTAGE CONVERTER

CROSS-REFERENCES TO RELATED APPLICATIONS

The present application relates to and claims priority from Japanese Patent Application No. 2010-073129, filed on Mar. 26, 2010, the entire disclosure of which is incorporated herein by reference.

BACKGROUND OF THE INVENTION

1. Field of the Invention

The invention relates to a voltage converter in which active components are embedded in (incorporated in, built in) a substrate.

2. Description of the Related Art

A non-insulated step-down DC-DC converter is an example of a voltage converter which is used in an active component mounted on an electronic device. FIG. 20 shows a configuration of a basic circuit of such a non-insulated step-down DC-DC converter. Here, when it is assumed that the input voltage of the non-insulated step-down DC-DC converter is Vin, the output voltage thereof is Vout, and the load resistance thereof is Rload, the state equation of this circuit is expressed by Equation 1 below.

[Equation 1]

$$\begin{pmatrix} \frac{d}{dt}i_{out} \\ \frac{d}{dt}V_{out} \end{pmatrix} = \begin{pmatrix} -\frac{R_s}{L} & -\frac{1}{L} \\ \frac{1}{C} & -\frac{1}{CR_{load}} \end{pmatrix} \begin{pmatrix} i \\ V_{out} \end{pmatrix} + D \times \begin{pmatrix} \frac{1}{L} \\ 0 \end{pmatrix} \times V_{in} \quad (1)$$

In Equation 1, Rs is the sum of the ON resistance of a switch PMOS or NMOS and the DC resistance of an inductor L, and D is the proportion (time ratio) of ON-time to a switching cycle.

In this case, in a steady state where the output voltage of the non-insulated step-down DC-DC converter is stable, since the values of the left matrix components in Equation 1 become 0, if Rs is assumed to have a value so small as to be negligible, an average output current iout and an average output voltage Vout satisfy relational equations as expressed by Equations 2 and 3 below.

[Equation 2]

$$i_{out} = \frac{D}{R_{load}} V_{in} \quad (2)$$

[Equation 3]

$$V_{out} = D \times V_{in} \quad (3)$$

Moreover, when the switching frequency of the switch is f, a ripple current ΔiL of the inductor L in the OFF period of the switch PMOS is expressed by Equations 4 and 5 below.

[Equation 4]

$$\frac{d}{dt}i_{out} = -\frac{1}{L}V_{out} = -\frac{D}{L}V_{in} \quad (4)$$

[Equation 5]

$$\therefore \Delta i_L = D \times \frac{T_{off}}{L} V_{in} = D(1-D)\frac{V_{in}}{Lf} \quad (5)$$

In the ON period of the switch PMOS, the same equation as Equation 5 is satisfied for the ripple current ΔiL of the inductor L. Therefore, the current flowing into the inductor L has a triangular waveform in which peaks appear in a constant output current.

Moreover, an output ripple voltage ΔVout can be calculated from the amount of charge stored in an output-side capacitor (condenser) Cout and is expressed by Equation 6 below.

[Equation 6]

$$\Delta V_{out} = \frac{\Delta Q}{C_{out}} = \frac{1}{C_{out}} \times \frac{1}{2} \times \frac{T}{2} \times \frac{\Delta i_L}{2} = \frac{T \times T_{off}}{8 C_{out} L} V_{in} = \frac{D(1-D)}{8 C_{out} L f^2} V_{in} \quad (6)$$

The output ripple voltage ΔVout also has a triangular waveform in which peaks appear in a constant output voltage similarly to the waveform of the ripple current ΔiL of the inductor. In this case, the output waveform of the output ripple voltage ΔVout can be controlled so as to approach substantially an ideal triangular waveform by decreasing the inductance of the inductor L and increasing the switching frequency f (i.e., decreasing the switching cycle T). That is, it is possible to decrease the amplitude (peak-to-peak) of the triangular waveform.

In recent years, devices in which such a voltage converter and active components including the same are mounted are increasingly being manufactured as device modules. In particular, there is an increasing demand for making such modules smaller and thinner. To cope with such a demand, for example, Patent Document 1 discloses a micro converter in which output stud terminals having a greater height than an active component are provided on a substrate having the active component mounted thereon, and the micro inductor is provided on the output stud terminals so that the active component and the micro inductor are arranged to be mounted in the direction vertical to the substrate surface.

Patent document 1: Japanese Unexamined Patent Publication No. 2004-63676

In the non-insulated step-down DC-DC converter described above, in order, to prevent a shoot-through current (a flow-through current) occurring in the circuit due to simultaneous turning ON of the two switches PMOS and NMOS, the switching timings of the two switches PMOS and NMOS are controlled so that they do not occur at the same time. However, although the occurrence of the shoot-through current can be prevented by controlling the switching timings in such a manner, another problem may be caused. That is, high-frequency noise may be generated in a period (turn-OFF period) in which the respective switches PMOS and NMOS perform switching.

For example, in the non-insulated step-down DC-DC converter shown in FIG. 20, when the second switch NMOS turns OFF, a parasitic diode (so-called internal diode between the source and the drain) D2 included in the second switch NMOS continuously supplies a voltage to the output-side components including the inductor L, the output-side capacitor (condenser) Cout, and the switch NMOS. Therefore, a voltage is applied to the parasitic diode D2, whereby charge is stored in a parasitic capacitor Cp2 which is equivalently included in the switch NMOS. In such a state, when the first switch PMOS is opened, the charge stored in the second switch NMOS is discharged to the input-side components including the input-side capacitor (condenser) Cin and the switches PMOS and NMOS. At that time, the parasitic capacitor Cp2 included in the second switch NMOS resonates with a parasitic inductor ESL included in the input-side capacitor (condenser) Cin. As a result, high-frequency noise is generated (however, the generation mechanism is not limited to this).

The high-frequency noise generated by such a mechanism is radiated (unnecessarily radiated) to the outside, and such spurious radiation may cause problems in the operation of surrounding devices or communication jamming between the surrounding devices and may propagate through a floating capacitance of the inductor L or the ground to appear in the output voltage. However, at present, substantially no countermeasures have been taken against the high-frequency noise in the modules mounting the voltage converter of the related art.

In addition, the use of a configuration in which electrical connection positions between the components of a voltage converter are decreased further, or a wire-to-wire distance is decreased further is generally difficult from the perspective of designing a wiring substrate on which the voltage converter is mounted. Moreover, even when such a design is employed, there is a possibility that it may increase various other noise components including high-frequency noise.

SUMMARY OF THE INVENTION

The invention has been made in view of the problems, and an object of the present invention is to provide a voltage converter capable of reliably preventing malfunctions of an electronic circuit to stably maintain an accurate operation by suppressing high-frequency noise generated on an input side.

In order to solve the problems, a voltage converter according to the invention includes: a substrate having an active component embedded therein; an input-side capacitor and an output-side capacitor which are mounted on the substrate and connected to a predetermined ground potential and which include a ground-side terminal; and a first conductor layer and a second conductor layer which are formed so as to interpose the active component therebetween and connected to a predetermined ground potential, wherein: the first conductor layer includes an input-side conductor layer which is connected to a ground-side terminal of the input-side capacitor, and an output-side conductor layer which is provided separately from the input-side conductor layer and connected to a ground-side terminal of the output-side capacitor; the second conductor layer is connected to terminals of the active component; a ground-side terminal of the input-side capacitor is connected to the second conductor layer through the input-side conductor layer; and a ground-side terminal of the output-side capacitor is connected to the second conductor layer through the output-side conductor layer.

According to this configuration, in the first conductor layer, the input-side conductor layer and the output-side conductor layer are formed separately (i.e., the input-side conductor layer and the output-side conductor layer are not in contact with each other in the first conductor layer). The input-side capacitor is connected to the input-side conductor layer, the output-side capacitor is connected to the output-side conductor layer, and the first conductor layer is connected to a predetermined ground potential. On the other hand, the input-side capacitor and the output-side capacitor are connected to each other through the input-side conductor layer of the first conductor layer, the second conductor layer, and the output-side conductor layer of the first conductor layer, and the second conductor layer is connected to a predetermined ground potential.

In other words, the input-side capacitor and the output-side capacitor are connected to different ground potentials through the output-side conductor layer and the input-side conductor layer, respectively, which are provided separately in the first conductor layer and are also connected to the same ground potential through the second conductor layer. That is, the input-side capacitor and the output-side capacitor can be said to be shared by the second conductor layer. Therefore, the predetermined ground potential connected to the input-side capacitor and the predetermined ground potential connected to the output-side capacitor are connected in an electrically high-impedance state. As a result, it is possible to cause high-frequency noise generated on the input side to be trapped in the input-side loop and to securely suppress the high-frequency noise from propagating to the output side. In this way, a malfunction of the active component such as an IC chip embedded in the substrate and eventually the voltage converter and unfavorable fluctuation of an output voltage can be reliably prevented, and an accurate operation of the active component and the voltage converter can be maintained stably.

In this specification, "substrate having an active component embedded therein" means not only an individual substrate (individual part or product) which is a unit substrate having an active component but also a substrate assembly (work board or sheet) having a plurality of such individual substrates. The kind of "active component" is not particularly limited, and examples thereof include a semiconductor device such as an IC chip used in a typical electronic device, and more specifically, a digital IC having a very high operation frequency such as CPU (Central Processing Unit) or DSP (Digital Signal Processor), an analog IC such as a high-frequency amplifier, an antenna switch, a high-frequency oscillation circuit, and the like.

When the active component is disposed so that the terminals of the active component face a side opposite to the input-side capacitor, the terminals of the active component can be spaced further from the input-side capacitor than when the terminals of the active component are disposed so as to face the input-side capacitor. With such a structure, signal lines which can be disposed around the active component can be also kept at a relatively long distance from the input-side capacitor. In this way, it is possible to more effectively suppress and block the high-frequency noise generated on the input side from coupling with various signal lines positioned around the active component.

In the above configuration, when the output-side conductor layer has an unevenness on a surface thereof and is formed so as to cover the active component, the area of the conductor layer covering the active component increases more than the area of the conductor layer which has no unevenness on the surface. The heat dissipation from the active component is accelerated (i.e., the heat dissipation property of the voltage converter is improved). In this way, it is possible to decrease the output-side electrical impedance and to decrease so-called thermal impedance.

When the output-side conductor layer has a plurality of holes which is formed at predetermined intervals, switching noise of the active component which is likely to pass through the output-side conductor layer can be easily suppressed (isolated or blocked), and switching loss due to leaked current or the like on the output side can be easily suppressed.

When a wiring configuration in which the ground-side terminal of the input-side capacitor is connected to the predetermined ground potential at one position (one point) is used, the input-side resistance can be easily increased depending on a lead-out path of wirings, for example. Thus, it is possible to further attenuate high-frequency noise which can be generated on the input side.

When the ground-side terminal of the output-side capacitor is connected to the predetermined ground potential at a plurality of positions (two points or more), the input-side resistance can be easily increased to be even higher than the output-side resistance depending on a lead-out path of the wirings, for example. Thus, it becomes easier to cause high-frequency noise which can be generated on the input side to be trapped in the input-side loop. As a result, it is possible to further suppress the high-frequency noise from flowing, leaking, diffusing, or propagating towards the output side.

DESCRIPTION OF THE PREFERRED EMBODIMENTS

Figure 1:
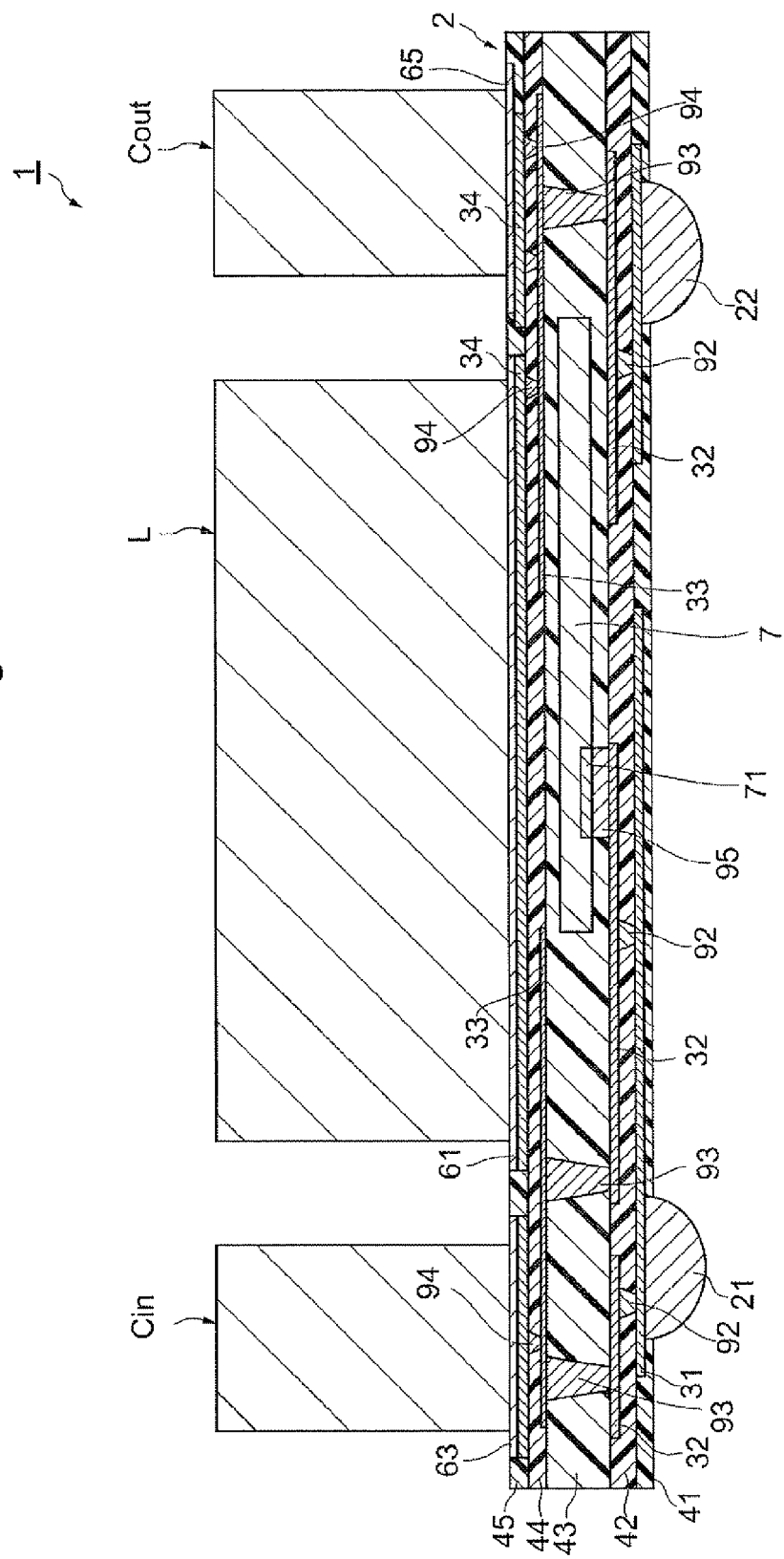
FIG. 1 is a cross-sectional view schematically showing a structure of a DC-DC converter 1 which is a preferred embodiment of a voltage converter of the invention.

Hereinafter, an embodiment of the invention will be described with reference to the drawings. In the drawings, the same elements will be denoted by the same reference numerals, and redundant description thereof will be omitted. The positional relations such as up, down, left, and right are assumed to be based on the positional relations shown in the drawings unless they are particularly stated in other ways. The dimensional ratios shown in the drawings are not limited to the illustrated ratios. Moreover, the embodiment below is used as an example for illustrating the invention but is not intended to limit the invention to the embodiment. Furthermore, the invention can be modified in various ways as long as such modifications do not depart from the spirit of the invention.

First Embodiment

Figure 2:
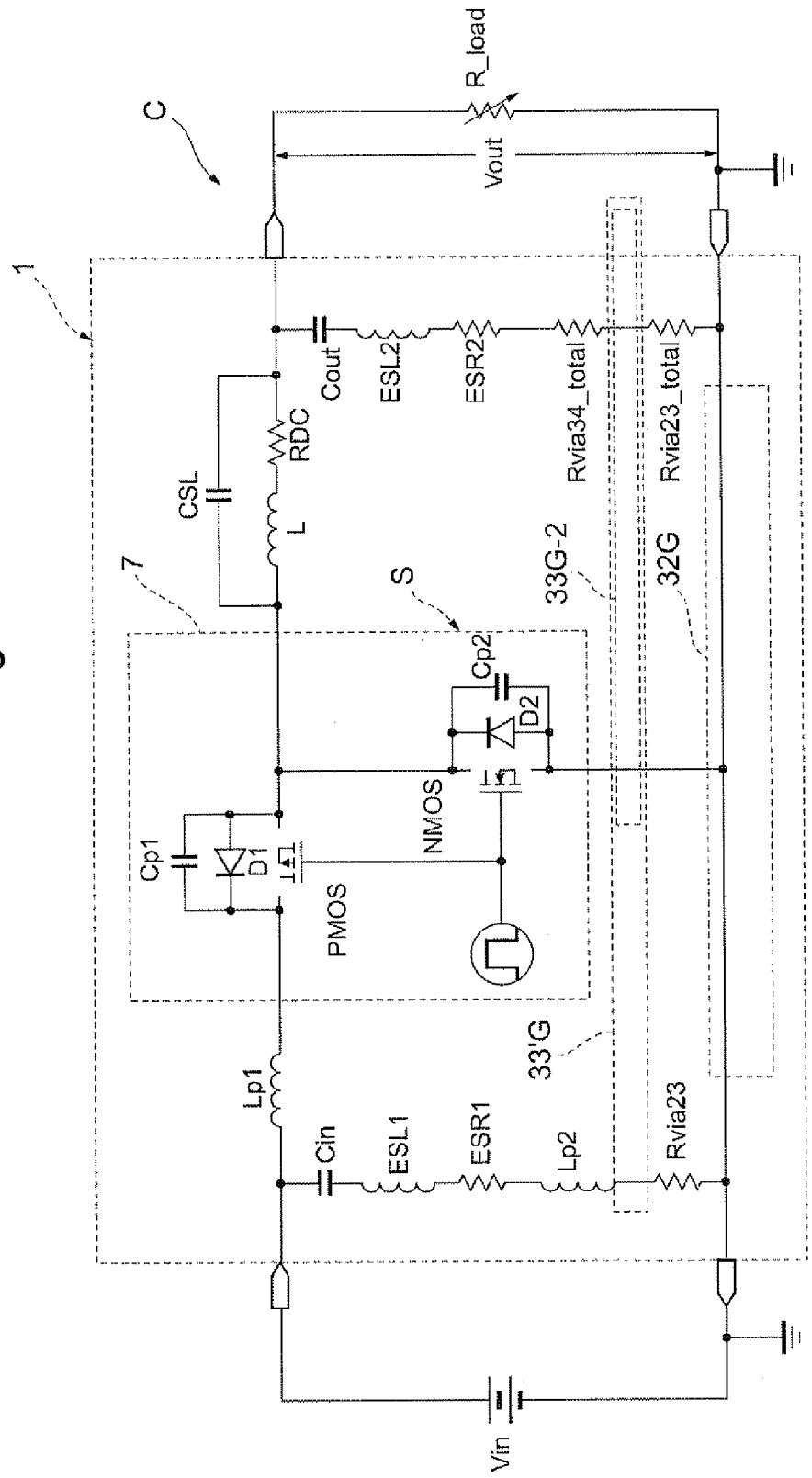
FIG. 2 is an equivalent circuit diagram of the DC-DC converter 1 shown in FIG. 1.

FIG. 1 is a cross-sectional view schematically showing a structure of a DC-DC converter (power supply module) 1 which is a preferred embodiment of a voltage converter according to the invention. The cross section shows a state in which the DC-DC converter 1 is divided at the position of an IC chip 7 described later and is seen from one side of the IC chip 7. FIG. 2 is an equivalent circuit diagram (including parasitic components) of the DC-DC converter 1 shown in FIG. 1.

Figure 19:
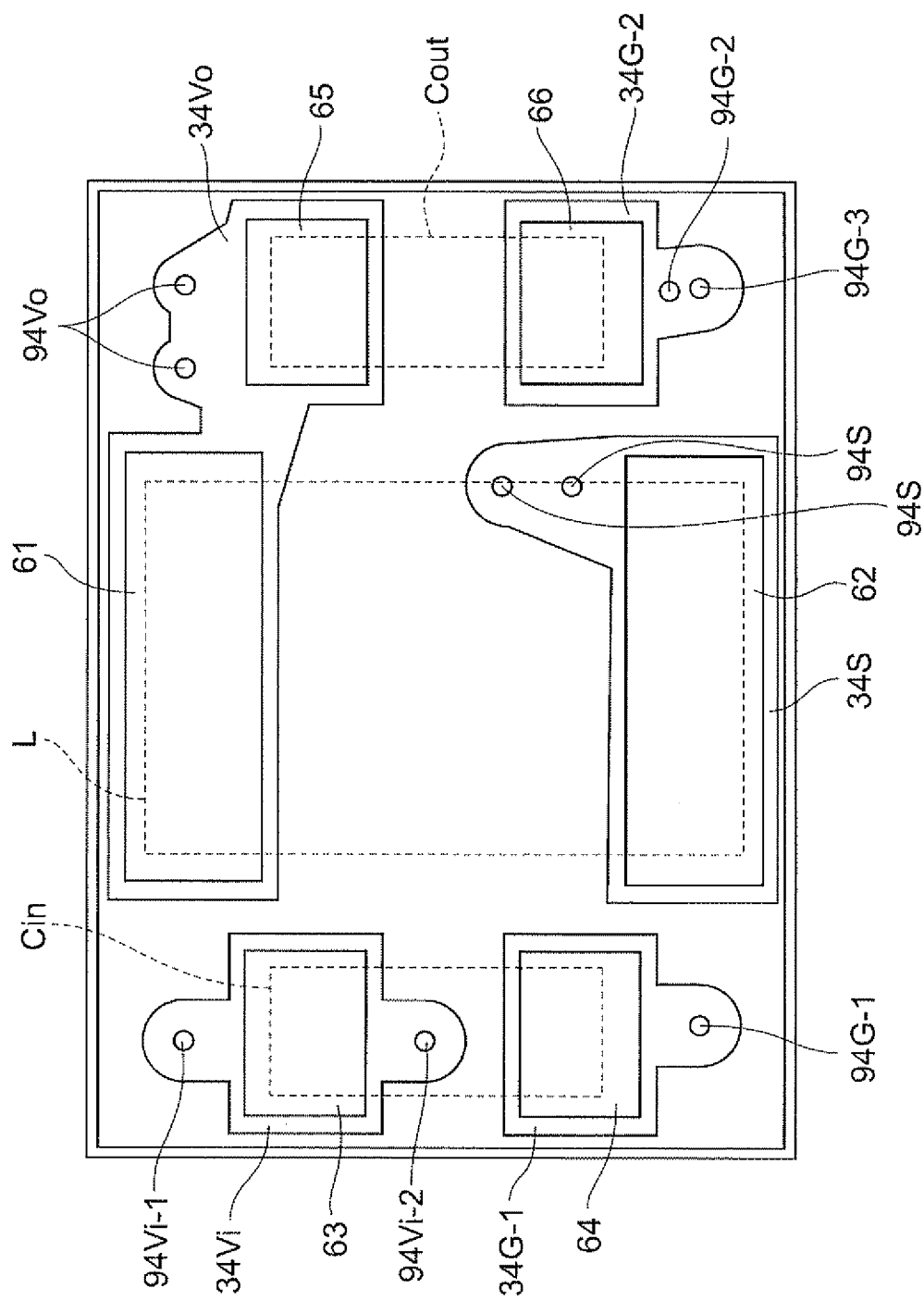
FIG. 19 is a wiring structure diagram when a fourth wiring layer 34 is seen in a plan view from the ground side along the line V-V shown in FIG. 14.
Figure 20:
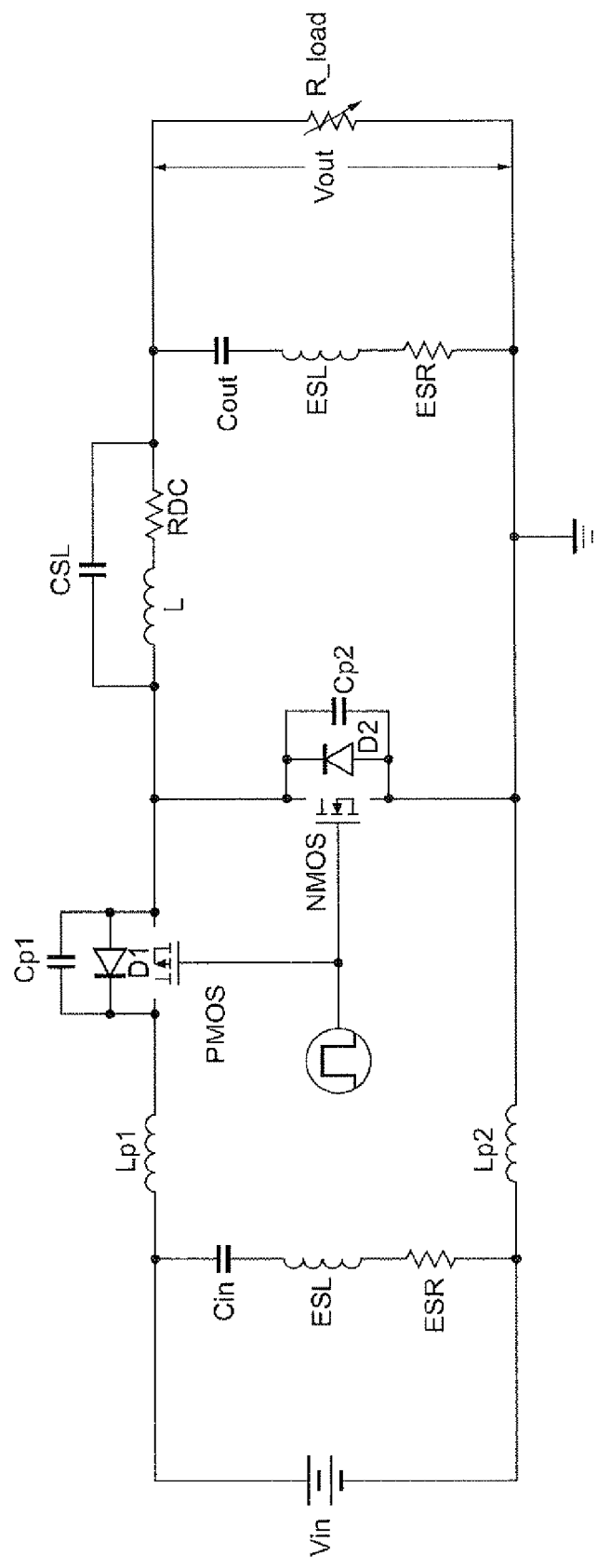
FIG. 20 is an equivalent circuit diagram of an example of a DC-DC converter of the related art.

The DC-DC converter 1 includes an active component embedded substrate (substrate) 2, an inductor (passive component) L connected to bonding regions (electrode pads) 61 and 62 of the active component embedded substrate 2, an input-side capacitor Cin connected to bonding regions (electrode pads) 63 and 64 of the active component embedded substrate 2, and an output-side capacitor Cout connected to bonding regions (electrode pads) 65 and 66 of the active component embedded substrate 2. An IC chip 7, for example, is embedded in the active component embedded substrate 2. Here, since the bonding regions 62, 64, and 66 are disposed on the front side of the drawing sheet of FIG. 1, illustrations thereof are omitted, and the bonding regions 62, 64, and 66 are shown in FIG. 19 described later.

As shown in the equivalent circuit diagram of FIG. 2, the IC chip 7 includes a control circuit C that performs switching control on an input voltage Vin to output a desired output voltage Vout and a switch circuit S that performs the actual switching operation. The switch circuit S has transistors such as MOSFETs, and in this embodiment, a PMOS transistor (switch PMOS) is used as a first switch, and an NMOS transistor (switch NMOS) is used as a second switch.

In the DC-DC converter 1, first to fifth insulating layers 41 to 45 and first to fourth wiring layers 31 to 34 are sequentially laminated in that order from the lowermost layer of the active component embedded substrate 2. The lowermost layer is a rear surface of the active component embedded substrate 2 on a surface opposite to a surface where the inductor L, the input-side capacitor Cin, and the output-side capacitor Cout are provided. Moreover, the IC chip 7 is embedded in the third insulating layer 43 at a predetermined position. In the first insulating layer 41 which is the lowermost layer of the active component embedded substrate 2, at least three output terminals 21 to 23 (e.g., BGA: Ball Grid Array, so-called user terminals) are formed in order to achieve electrical connection to external elements. Specifically, these output terminals are made up of an input voltage terminal (first input terminal) 21 that applies a voltage to the DC-DC converter 1, an output voltage terminal 22 that outputs an arbitrary voltage from the DC-DC converter 1, and a ground (GND) terminal 23 that is grounded to a ground potential (ground: 0 V, for example).

Since the ground terminal 23 is also disposed on the front side of the drawing sheet of FIG. 1, illustration thereof is omitted in FIG. 1.

The IC chip 7 includes output terminals (inner electrodes, bumps, lands, and the like) which are provided on the lowermost layer side so as to be electrically connected to the first to fourth wiring layers 31 to 34, respectively. These output terminals are made up of at least three terminals 71 to 73 that are connected to the at least three output terminals 21 to 23 formed on the lowermost layer of the active component embedded substrate 2 and in addition a feedback (FB) terminal 74 that monitors and controls the output voltage smoothed by the inductor L and capacitor Cout so as to fall within a predetermined reference voltage. The at least three terminals 71 to 73 are included an input voltage terminal (input voltage terminal) 71, a switch (SW) terminal (switching terminal) 72 that performs switching control on an input voltage, and a ground (GND) terminal (ground terminal) 73.

In this way, the IC chip 7 is provided in a so-called face-down configuration in which the terminals 71 to 74 are disposed so as to face the lowermost layer of the active component embedded substrate 2. The input voltage terminal 71 and ground terminal 73 and the switch terminal 72 and feedback terminal 74 are respectively provided so as to overlap with each other in the depth direction of the drawing sheet in the viewing direction of FIG. 1 (see FIGS. 17 and 18 described later). Moreover, the ground terminal 73 and the feedback terminal 74 are provided so as to overlap with each other in the horizontal direction of the drawing sheet, and the input voltage terminal 71 and the switch terminal 72 are provided so as not to overlap with each other in the horizontal direction of the drawing sheet (see FIGS. 17 and 18 described later). Among these terminals, only the input voltage terminal 71 is illustrated in FIG. 1 which is a cross-sectional view.

The active component embedded substrate 2 does not have any output terminal which corresponds to the feedback terminal 74 of the IC chip 7. Since the feedback terminal 74 of the IC chip 7 is designed to monitor the smoothed output voltage, it can perform its role as long as it is connected to the output voltage terminal 22 of the active component embedded substrate 2.

In the DC-DC converter 1 configured in this way, the input voltage terminal 71 and ground terminal 73 which are one line of output terminals on one side of the IC chip 7 are electrically connected to the input voltage terminal 21 and ground terminal 23, respectively, which are one line of terminals on one side of the active component embedded substrate 2, through these wiring conductors.

The input voltage terminal 71 of the IC chip 7 is connected to the second wiring layer 32 through a via-conductor 95 and is further connected to the first wiring layer 31 and the input voltage terminal 21 formed on the active component embedded substrate 2 through a via-conductor 92. Moreover, the input voltage terminal 71 of the IC chip 7 is connected to the input-side capacitor Cin through the via-conductor 95, a via-conductor 93 connected to the third wiring layer 33, a via-conductor 94 connected to the fourth wiring layer 34, and the electrode pad 61 which is the bonding region.

The switch terminal 72 of the IC chip 7 is connected to the second wiring layer 32 through the via-conductor 95 and is further connected to the inductor L through the via-conductor 93 connected to the third wiring layer 33, the via-conductor 94 connected to the fourth wiring layer 34, and the electrode pad 62 which is the bonding region.

The ground terminal 73 of the IC chip 7 is connected to the second wiring layer 32 through the via-conductor 95 and is further connected to the first wiring layer 31 and the ground terminal 23 formed on the active component embedded substrate 2 through the via-conductor 92. Moreover, the ground terminal 73 of the IC chip 7 is connected to the input-side capacitor Cin and the output-side capacitor Cout through the via-conductor 95, the via-conductor 93 connected to the third wiring layer 33, the via-conductor 94 connected to the fourth wiring layer 34, and the electrode pads 64 and 66 which are bonding regions.

The feedback terminal 74 of the IC chip 7 is connected to the second wiring layer 32 through the via-conductor 95 and is further connected to the first wiring layer 31 and the output voltage terminal 22 formed on the active component embedded substrate 2 through the via-conductor 92. Moreover, the feedback terminal 74 of the IC chip 7 is connected to the inductor L through the via-conductor 95, the via-conductor 93 connected to the third wiring layer 33, the via-conductor 94 connected to the fourth wiring layer 34, and the electrode pad 61 which is the bonding region. The feedback terminal 74 is further connected to the output-side capacitor Cout through the via-conductors 95, 93, and 94 and the electrode pad 65 which is the bonding region.

When the DC-DC converter 1 is operated as shown in FIG. 2, various parasitic components can be included in the respective elements of the input-side capacitor Cin, the switches PMOS and NMOS, the inductor L and the output-side capacitor Cout. Specifically, parasitic inductors ESL1 and ESL2 and parasitic resistors ESR1 and ESR2 can be included in the input-side capacitor Cin and the output-side capacitor Cout, respectively, and parasitic diodes D1 and D2 and parasitic capacitors Cp1 and Cp2 can be included in the switches PMOS and NMOS, respectively. Moreover, a parasitic resistor RDC and a parasitic capacitor CSL can be included between the coils of the inductor L. Furthermore, magnetic fluxes Lp1 and Lp2 leaking from the input-side components including the input-side capacitor Cin and the switches PMOS and NMOS can be included between the coils of the inductor L.

In this specification (particularly in the description subsequent to this paragraph), "input side (primary side)" represents a loop on a circuit (wiring) formed from the input-side capacitor Cin and the switches PMOS and NMOS, and "output side (secondary side)" represents a loop on a circuit (wiring) formed from the inductor L, the output-side capacitor Cout, and the switch NMOS. Moreover, in the equivalent circuit diagram shown in FIG. 2, the resistances Rvia23, Rvia23_total, and Rvia34_total of the vias (conductors) formed in the invention as well as a ground layer (the second conductor layer) 32G, a ground layer (the first conductor layer and the input-side conductor layer) 33G-1, and a ground layer (the first conductor layer and the output-side conductor layer) 33G-2 are also depicted, and the details thereof will be described later.

FIGS. 3 to 13 are process diagrams (process flow diagrams) showing an example of a procedure of manufacturing the active component embedded substrate 2 of the DC-DC converter 1.

Figure 3:
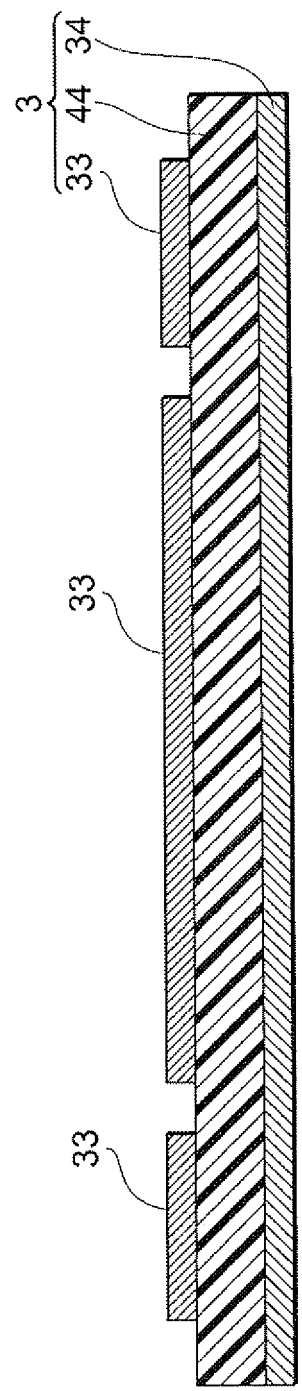
FIG. 3 is a process diagram showing an example of a procedure of manufacturing an active component embedded substrate 2.

First, a core substrate 3 having a patterned third wiring layer 33 and a fourth wiring layer 34 is prepared with a known method, such as one including drilling a double-face CCL (copper clad laminate), more specifically, a double-face copper clad glass epoxy laminate, plating it non-electrolytically and electrolytically, and removing unnecessary plating by etching or the like. (FIG. 3).

Figure 4:
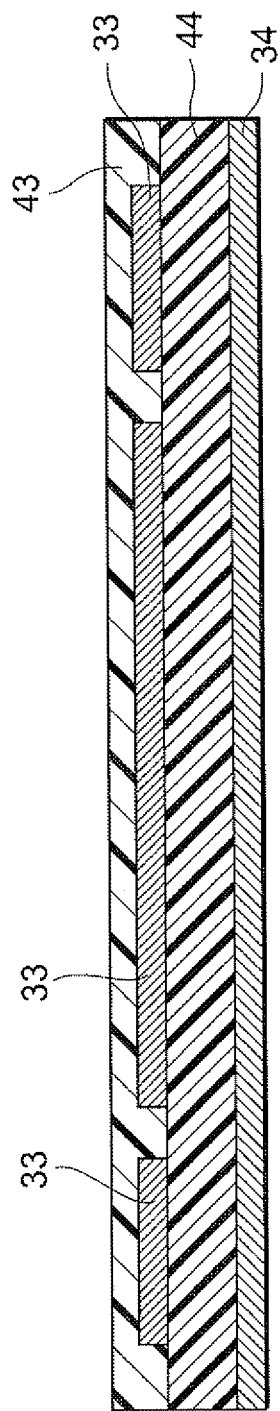
FIG. 4 is another process diagram showing an example of the procedure of manufacturing the active component embedded substrate 2.
Figure 5:
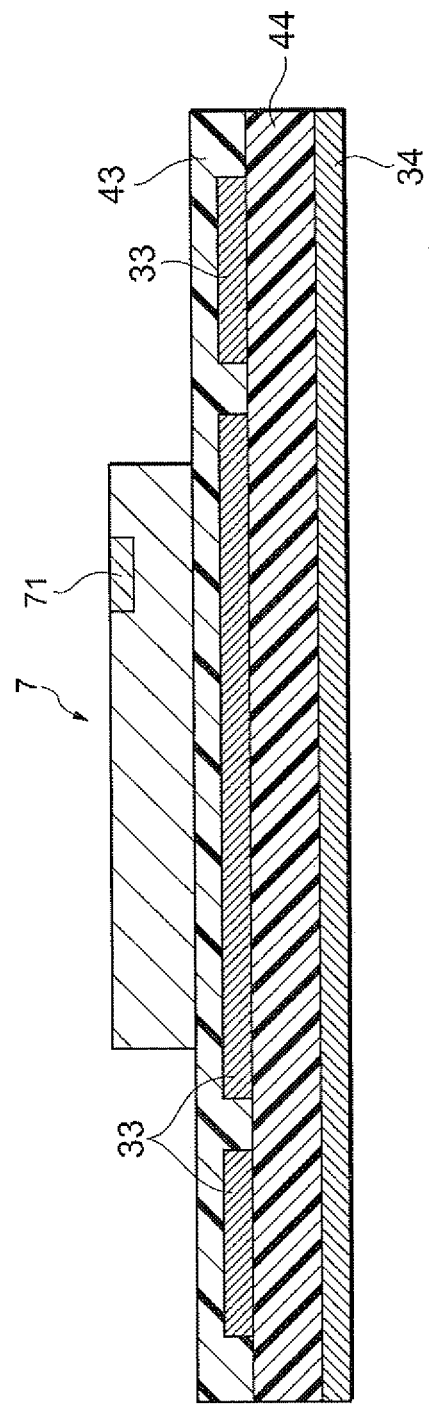
FIG. 5 is another process diagram showing an example of the procedure of manufacturing the active component embedded substrate 2.

Subsequently, an insulating resin film is vacuum-bonded onto the core substrate 3 to laminate an uncured third insulating layer 43, thus forming a RCC (Resin Coated Copper) structure (FIG. 4).

Figure 6:
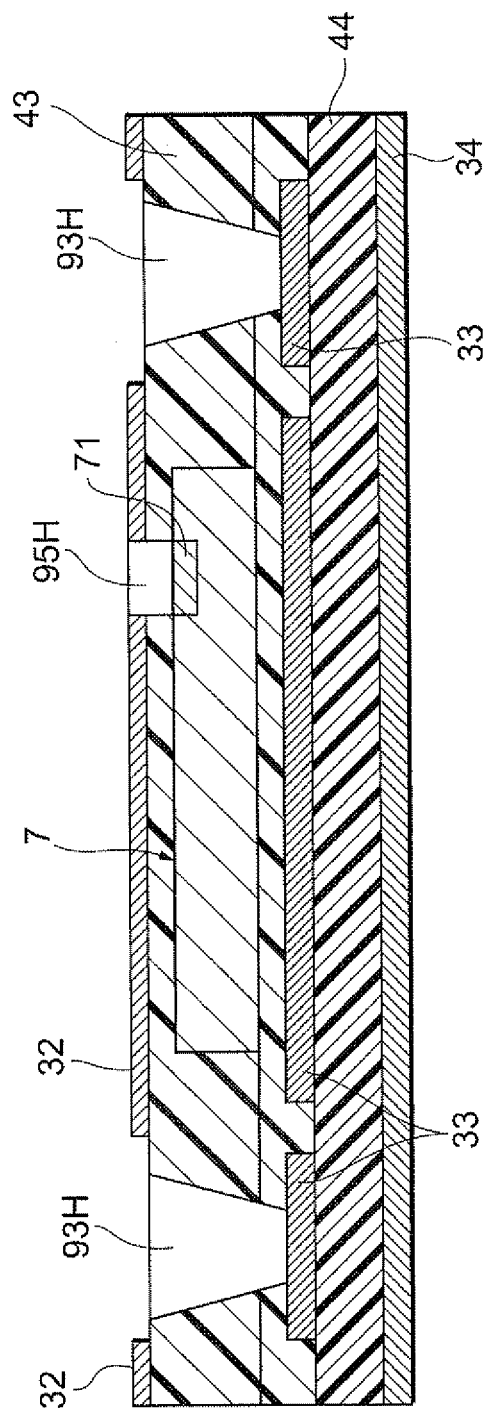
FIG. 6 is another process diagram showing an example of the procedure of manufacturing the active component embedded substrate 2.

After the IC chip 7 is mounted on the uncured third insulating layer 43 in a so-called face-up state (FIG. 5), an uncured resin is covered thereon so as to bury the IC chip 7 in the third insulating layer 43, and the third insulating layer 43 is cured. Subsequently, unnecessary portions of the second wiring layer 32 formed by superimposing copper foil on the third insulating layer 43 are removed by etching or the like. After that, via-holes 93H and 95H are formed at the positions where the second wiring layer 32 is removed by a known method. In this way, the third wiring layer 33 is exposed to the bottom portion of the via-hole 93H, and the respective terminals 71 to 74 of the IC chip 7 are exposed to the bottom portion of the via-hole 95H (FIG. 6). In FIG. 6, only the input voltage terminal 71 is illustrated.

Figure 7:
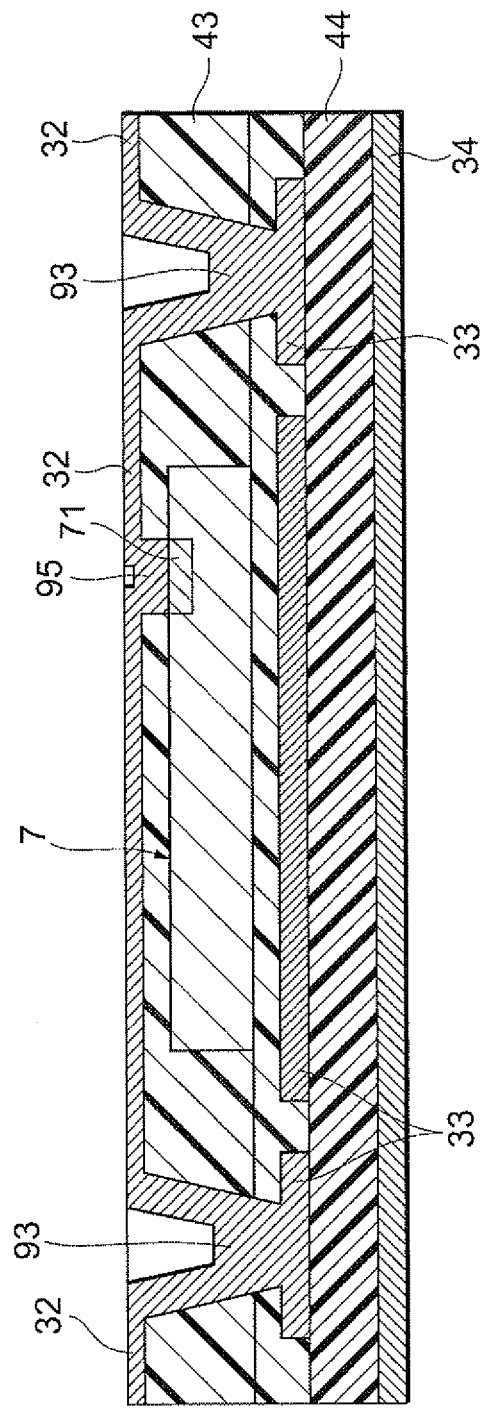
FIG. 7 is another process diagram showing an example of the procedure of manufacturing the active component embedded substrate 2.

Thereafter, plating of copper or the like is performed on the core substrate 3 on which the via-holes 93H and 95H are formed so that the second and third wiring layers 32 and 33, and the second wiring layer 32 and the terminals 71 to 74 of the IC chip 7 are respectively connected by the via-conductors 93 and 95 (FIG. 7).

Figure 8:
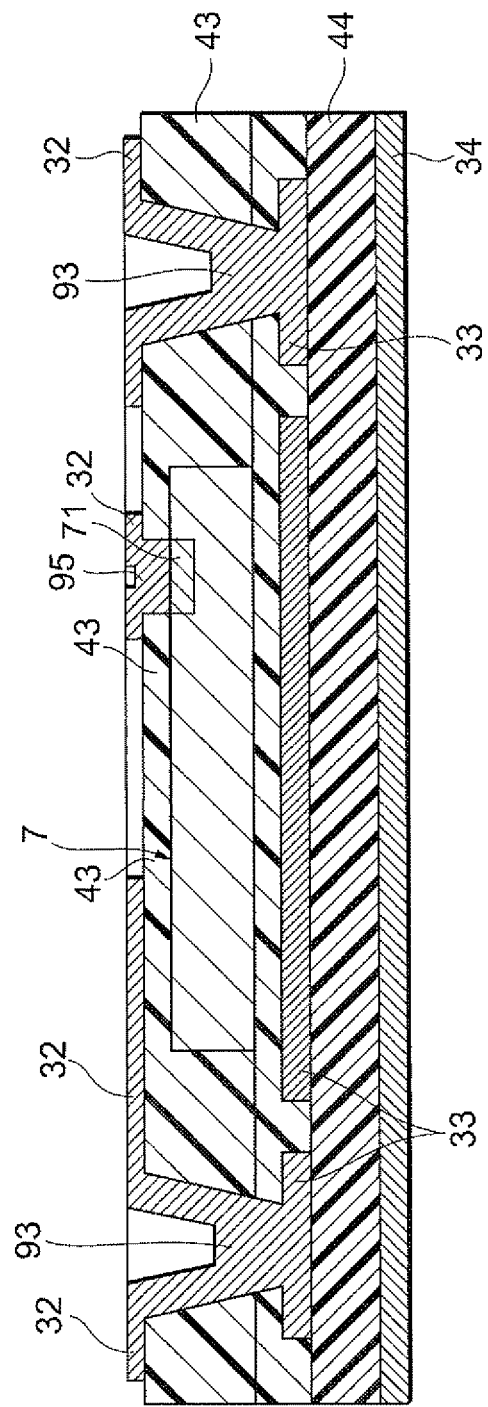
FIG. 8 is another process diagram showing an example of the procedure of manufacturing the active component embedded substrate 2.
Figure 9:
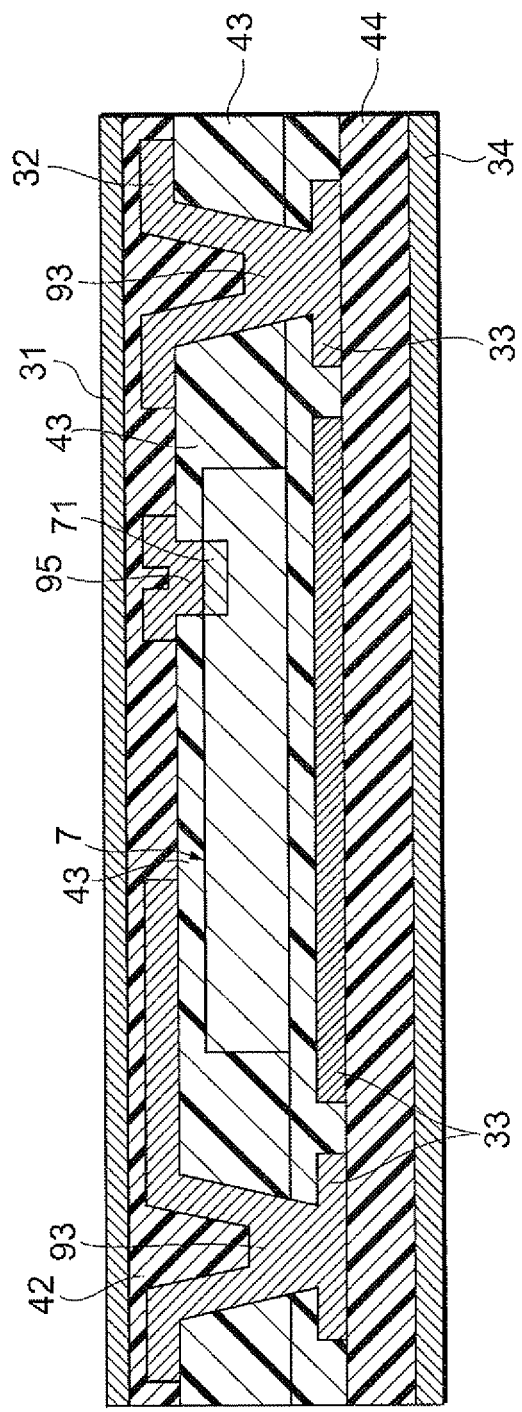
FIG. 9 is another process diagram showing an example of the procedure of manufacturing the active component embedded substrate 2.

Subsequently, the second wiring layer 32 is subjected to patterning by etching or the like so as to form a wiring pattern of the second wiring layer 32 (FIG. 8). Subsequently, a resin is filled onto the second wiring layer 32 and the via-holes 93H and 95H so as to form an uncured second insulating layer 42, and copper coil or the like is laminated thereon to form the first wiring layer 31. After that, the entire substrate is pressed by a heat press method or the like, whereby the second insulating layer 42 is cured and the adhesion between the respective laminated layers, specifically the first to fourth wiring layers 31 to 34, the second to fourth insulating layers 42 to 44, and the IC chip 7 is increased (FIG. 9).

Figure 10:
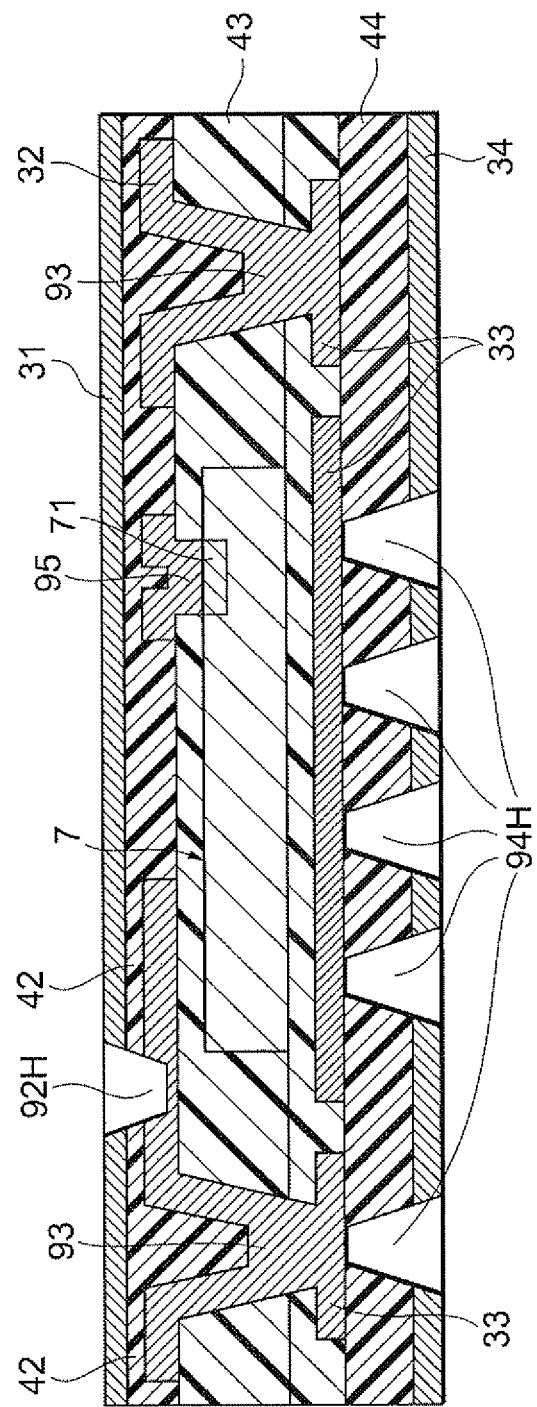
FIG. 10 is another process diagram showing an example of the procedure of manufacturing the active component embedded substrate 2.

After that, unnecessary portions of the first and fourth wiring layers 31 and 34 which are the two outermost layers in that state are removed by etching or the like, and via-holes 92H and 94H are formed so that the second and third wiring layers 32 and 33 are exposed to the bottom portions of the via-holes 92H and 94H, respectively (FIG. 10).

Figure 11:
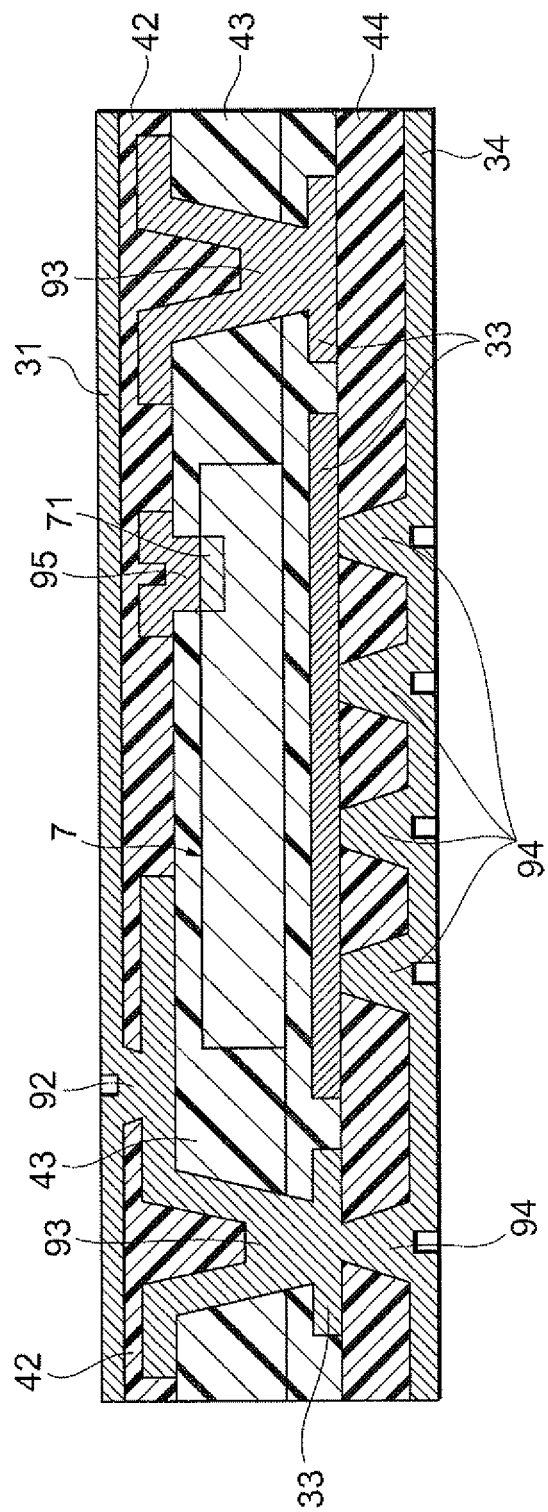
FIG. 11 is another process diagram showing an example of the procedure of manufacturing the active component embedded substrate 2.
Figure 12:
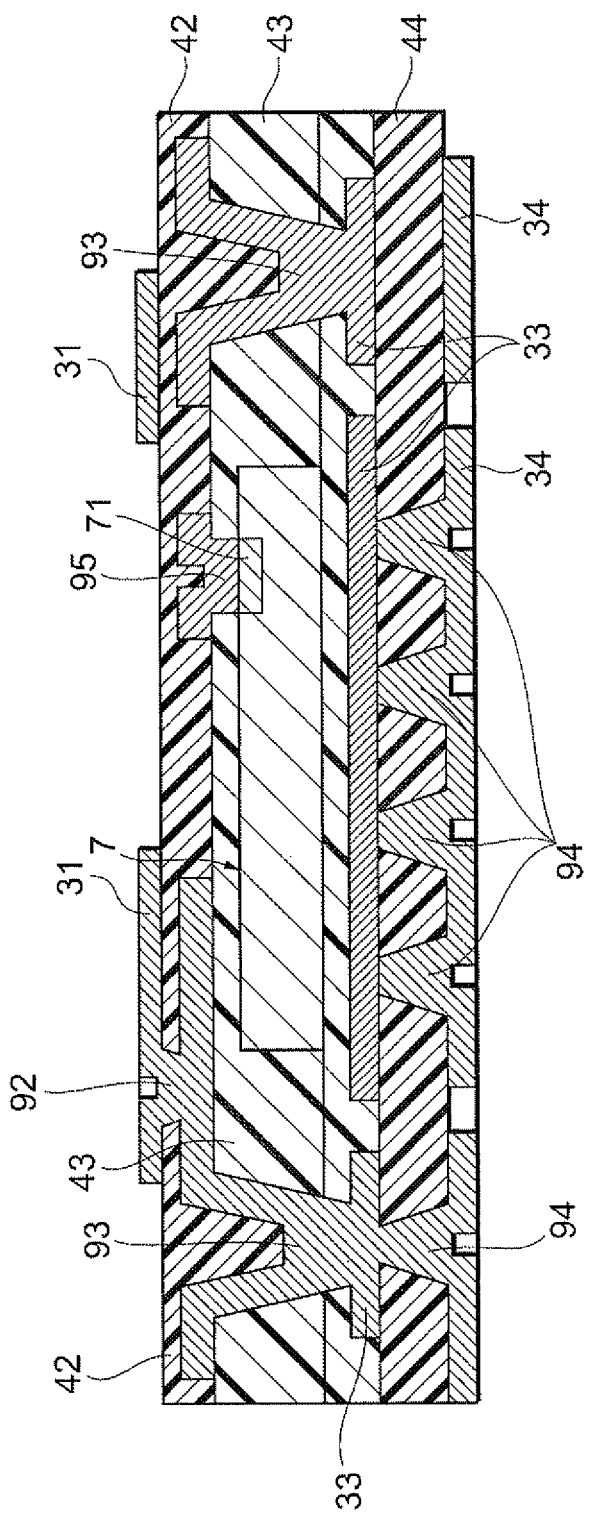
FIG. 12 is another process diagram showing an example of the procedure of manufacturing the active component embedded substrate 2.

Subsequently, copper plating is performed on the inner portions of the via-holes 92H and 94H and the first and fourth wiring layers 31 and 34 so that the first and second wiring layers 31 and 32 and the third and fourth wiring layers 33 and 34 are connected to the via-conductors 92 and 94, respectively (FIG. 11). After that, the first and fourth wiring layers 31 and 34 are subjected to patterning by etching or the like so as to form the wiring patterns thereof (FIG. 12).

Figure 13:
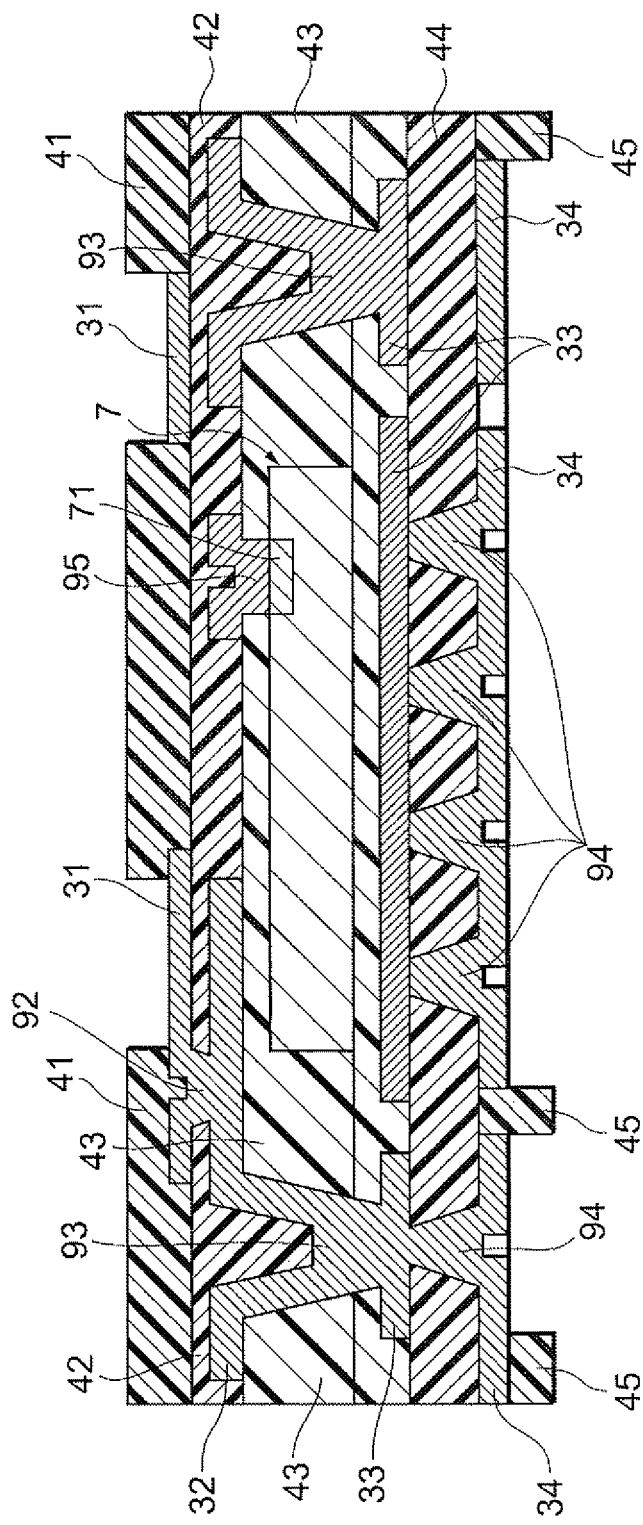
FIG. 13 is another process diagram showing an example of the procedure of manufacturing the active component embedded substrate 2.

Subsequently, a solder resist is applied on the wiring patterns of the first and fourth wiring layers 31 and 34 and appropriate portions other than the wiring patterns to form the first and fifth insulating layers 41 and 45 which are mask layers, whereby the active component embedded substrate 2 is obtained (FIG. 13). Then, the active component embedded substrate 2 is turned upside down, and in such a state, the inductor L which is a passive element, and the input-side capacitor Cin and output-side capacitor Cout are mounted thereon and connected, whereby the DC-DC converter 1 is manufactured.

A wiring structure when the active component embedded substrate 2 of the DC-DC converter 1 formed in this way is seen in a plan view from the ground side (the side opposite to the inductor L) for each of the wiring layers 31 to 34 will be described in detail with reference to FIGS. 14 to 19. First, FIG. 14 is a cross-sectional view schematically showing a main part of the active component embedded substrate 2 of this embodiment, and FIG. 15 is a wiring structure diagram (I-I cross-sectional view) when the first wiring layer 31 is seen in a plan view from the ground side along the line I-I shown in FIG. 14.

In the first wiring layer 31, an input voltage wiring pattern 31Vi, a ground wiring pattern 31G, and an output voltage wiring pattern 31Vo are formed. Moreover, on the first wiring layer 31, various terminals for achieving electrical connection to external elements, namely the input voltage terminal 21, the output voltage terminal 22, and the ground terminal 23 are formed. Furthermore, an input voltage via-conductor 92Vi, an output voltage via-conductor 92Vo, and ground via-conductors 92G and 92G are formed in order to achieve electrical connection to the second wiring layer 32 laminated thereon. The ground wiring pattern 31G formed on the first wiring layer 31 integrally connects the two ground via-conductors 92G and 92G and the ground terminal 23 formed on the active component embedded substrate 2. The various wiring patterns 31Vi, 31Vo, and 31G connect the various output terminals 21 to 23 and the respective via-conductors 92Vi, 92Vo, and 92G corresponding to the output terminals 21 to 23.

Figure 14:
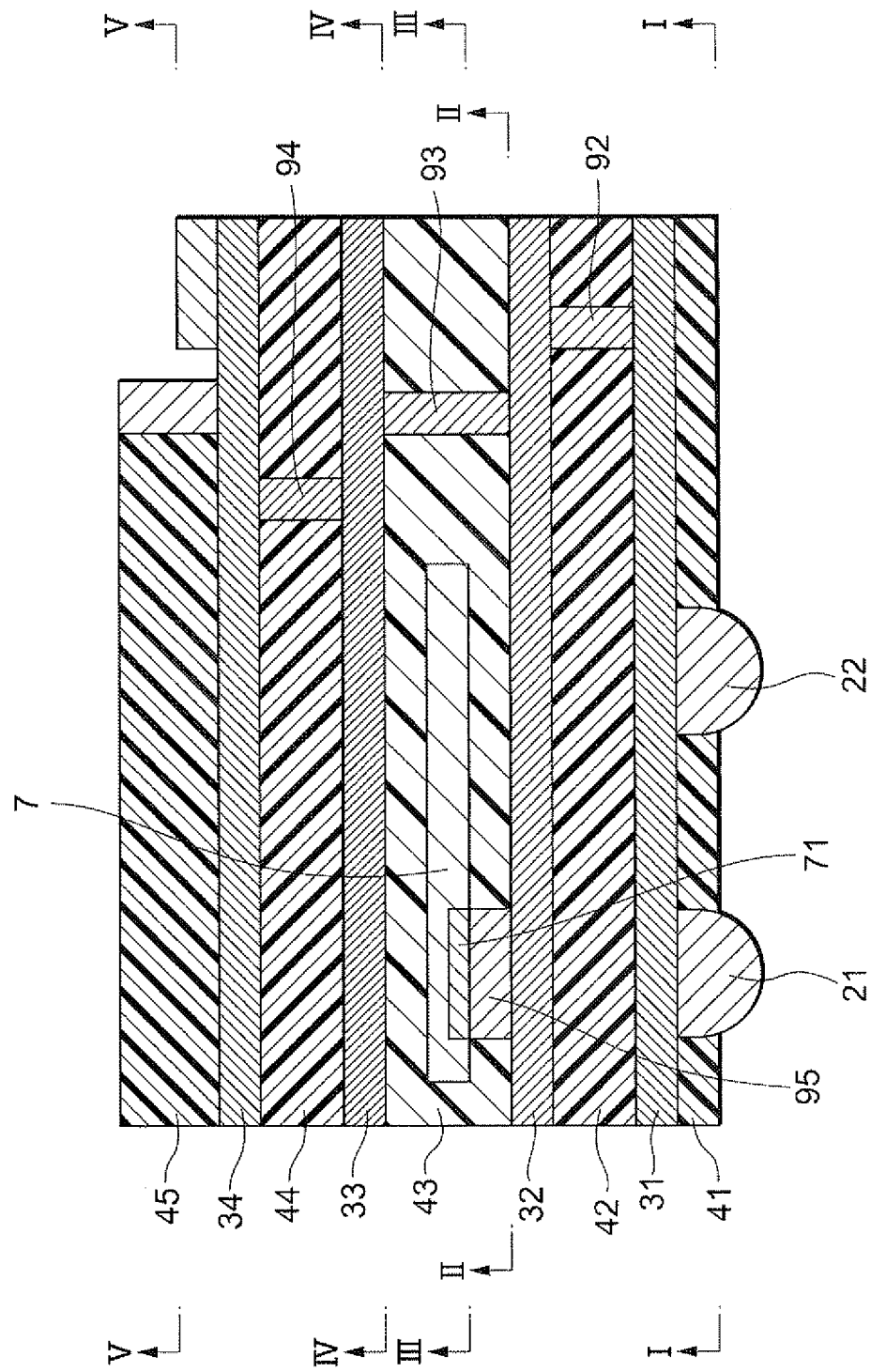
FIG. 14 is a cross-sectional view schematically showing a main part of the active component embedded substrate 2 of the embodiment of the invention.
Figure 15:
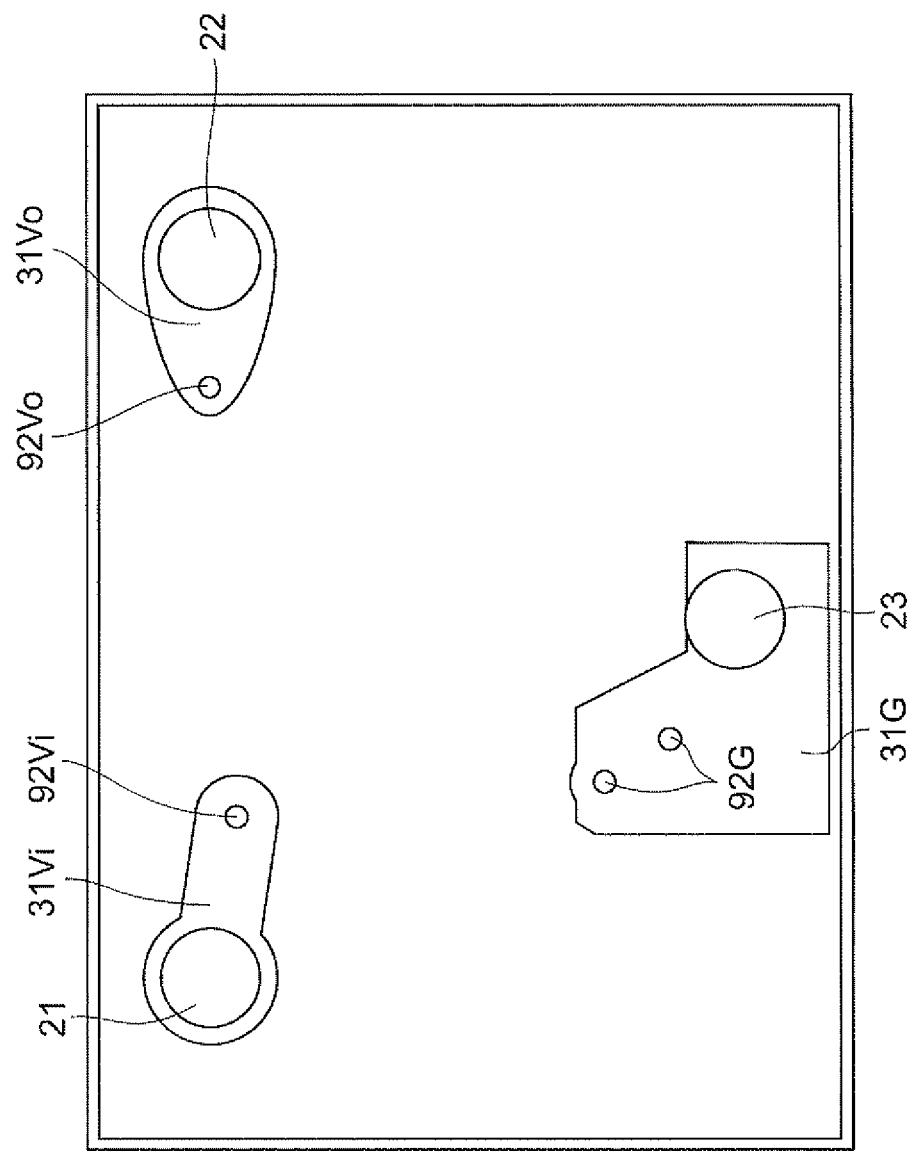
FIG. 15 is a wiring diagram when a first wiring layer 31 is seen in a plan view from a ground side along the line I-I shown in FIG. 14.
Figure 16:
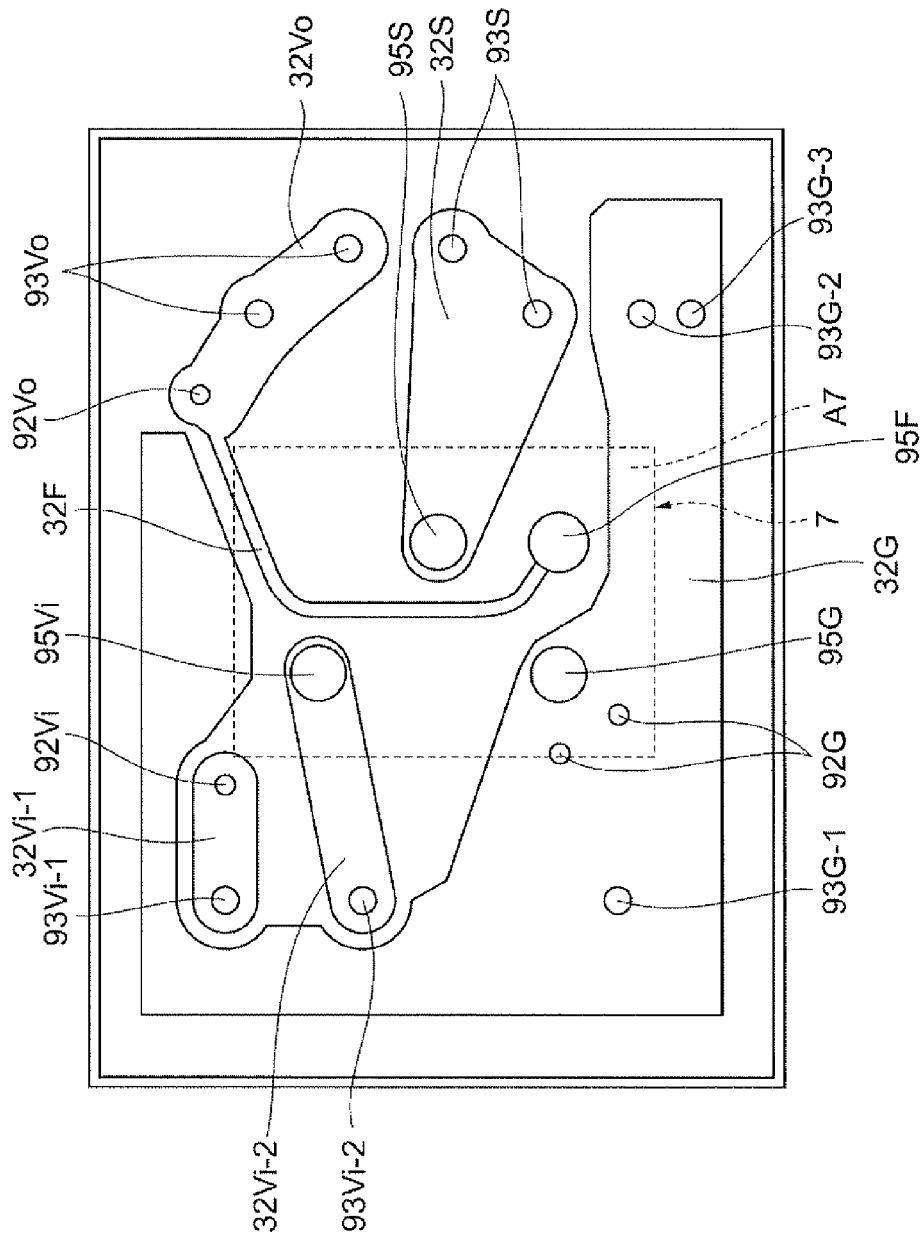
FIG. 16 is a wiring diagram when a second wiring layer 32 is seen in a plan view from the ground side along the line II-II shown in FIG. 14.

FIG. 16 is a wiring structure diagram (II-II cross-sectional view) when the second wiring layer 32 is seen in a plan view from the ground side along the line II-II shown in FIG. 14.

In the second wiring layer 32, two input voltage wiring patterns (driving signal lines) 32Vi-1 and 32Vi-2, a ground wiring pattern (driving signal line) 32G, a switching wiring pattern (switching signal line) 32S, an output voltage wiring pattern (driving signal line) 32Vo, and a feedback wiring pattern (feedback signal line) 32F are formed.

Moreover, in the second wiring layer 32, the input voltage via-conductor 92Vi, the output voltage via-conductor 92Vo, and the ground via-conductors 92G and 92G are formed in order to achieve connection to the first wiring layer 31. Furthermore, two input voltage via-conductors 93Vi-1 and 93Vi-2, two output voltage via-conductors 93Vo and 93Vo, two switching via-conductors 93S and 93S, and three ground via-conductors 93G, 93G, and 93G are formed in order to achieve connection to the third wiring layer 33. In addition, various via-conductors 95Vi, 95G, 95F, and 95S are formed so as to be connected to the various terminals 71 to 74 of the IC chip 7.

Both ends of the input voltage wiring pattern 32Vi-1 are connected to the input voltage via-conductors 92Vi and 93Vi-1. Both ends of the input voltage wiring pattern 32Vi-2 are connected to the input voltage via-conductors 93Vi-2 and 95Vi. The input voltage via-conductor 95Vi is connected to the input voltage terminal 71 of the IC chip 7.

Moreover, both ends of the output voltage wiring pattern 32Vo are connected to the output voltage via-conductors 92Vo, 93Vo, and 93Vo. The switching wiring pattern 32S is integrally connected to the via-conductor 95S connected to the switch terminal 72 of the IC chip 7 and the switching via-conductors 93S and 93S.

Furthermore, the ground wiring pattern 32G is integrally connected to the via-conductor 95G connected to the ground terminal 73 of the IC chip 7, the ground via-conductors 92G and 92G for achieving connection to the first wiring layer 31, and the three ground via-conductors 93G-1, 93G-2, and 93G-3 for achieving connection to the third wiring layer 33.

The ground wiring pattern 32G demarcates a ground layer on which the ground via-conductors 93G-1, 93G-2, and 93G-3 formed at the side ends of the IC chip 7, which are both ends of the active component embedded substrate 2, the via-conductor 95G connected to the ground terminal 73 of the IC chip 7, and the ground via-conductors 92G and 92G are integrally formed. In this embodiment (see FIG. 16), the ground wiring pattern 32G is formed so as to surround the feedback wiring pattern 32F and the input voltage wiring patterns 32Vi-1 and 32Vi-2 and is also formed in the vicinity of the switching wiring pattern 32S.

In the wiring structure formed in this way, among the ground via-conductors 93G-1, 93G-2, and 93G-3 for achieving connection to the third wiring layer 33, the ground via-conductor 93G-1 is a member that constitutes a part of the input side in the equivalent circuit diagram shown in FIG. 2 and corresponds to the via-resistor Rvia23 connected to the input-side capacitor Cin. Moreover, the ground via-conductors 93G-2 and 93G-3 are members that constitute a part of the output side in the equivalent circuit diagram shown in FIG. 2 and correspond to the via-resistor Rvia23_total connected to the output-side capacitor Cout. Furthermore, the ground wiring pattern 32G corresponds to a lead line connected to the ground which is a predetermined ground potential in the equivalent circuit diagram shown in FIG. 2.

According to this configuration (see FIG. 2), the input-side capacitor Cin is connected to the ground at one position (one point) through one via-resistor Rvia23 (the via-conductor 93G-1). In contrast, the output-side capacitor Cout is connected to the ground through a plurality of via-conductors 93G-2 and 93G-3. The plurality of via-conductors 93G-2 and 93G-3 are connected in parallel on the circuit, and these parallel via-conductors 93G-2 and 93G-3 are connected to the ground. In the drawing, the plurality of via-conductors 93G-2 and 93G-3 correspond to the via-resistor Rvia23_total, and this via-resistor Rvia23_total is connected to the ground.

With this configuration, in the second wiring layer 32, the resistance of the input-side via-conductor can become higher than the resistance of the output-side parallel via-conductors. Therefore, since the resistance of the input-side via-conductor can be increased to be higher than the resistance of the output-side via-conductor, it is possible to effectively attenuate high-frequency noise generated on the input side. Moreover, by forming the via-conductor so that the resistance of the input-side via-conductor is higher than the resistance of the output-side via-conductor, it is possible to cause the high-frequency noise generated with a switching operation to be trapped in the input-side loop. Thus, it is possible to effectively prevent the high-frequency noise from propagating towards the output side.

Since, as a common ground layer for both the input and output sides, the ground wiring pattern 32G is formed so as to surround the IC chip 7 and over a wide area of the active component embedded substrate 2, the ground wiring pattern 32G functions effectively as an electromagnetic shield. With this configuration, the high-frequency noise which can be generated on the input side in accordance with the switching operation can be absorbed and cancelled by the ground wiring pattern 32G. Thus, it is possible to further stabilize the operation of the IC chip 7 and the DC-DC converter 1.

Since the input voltage wiring patterns 32Vi-1 and 32Vi-2 are formed separately, a current supplied from the input voltage terminal 21 is prevented from flowing directly into the IC chip 7 by the via-conductor 93Vi-2 which is provided midway on a wiring that connects the IC chip 7 and the input-side capacitor Cin. Moreover, the current supplied from the input voltage terminal 21 can be reliably supplied to the input-side capacitor Cin. Furthermore, since the separate input voltage wiring patterns 32Vi-1 and 32Vi-2 are formed in addition to the via-conductor 93Vi-2, it is possible to secure a reliable wiring path to the input-side capacitor Cin.

A part of the feedback wiring pattern 32F is preferably formed so as to cross horizontally (vertically) the extension direction of the input voltage wiring patterns 32Vi-1 and 32Vi-2 and the switching wiring pattern 32S.

In this embodiment (see FIG. 16), a part of the feedback wiring pattern 32F is formed so as to cross horizontally (vertically) a space between the terminals 71 and 73 and the terminals 72 and 74 and other wiring patterns 32Vi-1, 32Vi-2, and 32S along the long side of the IC chip 7. More specifically, a part of the feedback wiring pattern 32F is formed so as to pass approximately the center of the IC chip 7 and approximately perpendicular to the wiring patterns 32Vi-1, 32Vi-2, and 32S.

By forming the feedback wiring pattern 32F in such a manner, the contact with various signal lines can be suppressed as much as possible. Thus, it is possible to prevent mutual interference with various signal lines and prevent capacitive coupling with the signal lines. Accordingly, it is possible to suppress or block superimposition of noise on the feedback wiring pattern 32F which is the feedback signal line and to further stabilize the feedback signal.

The feedback wiring pattern 32F is connected to the feedback terminal 74, the via-conductor 95F, and the output voltage via-conductors 92Vo, 93Vo, and 93Vo, and at least a part of the feedback wiring pattern 32F is formed on an inner side in relation to the outer circumference (outer frame) of a mounting area (packaging area) A7 of the IC chip 7 when the active component embedded substrate 2 is seen in a plan view as shown in FIG. 16. In other words, at least a part of the feedback wiring pattern 32F is formed under the mounted IC chip 7 so as to overlap with the IC chip 7 (in the planar direction of the active component embedded substrate 2) in a state where the active component embedded substrate 2 is seen in a plan view. Moreover, since the feedback wiring pattern 32F is formed so as to be approximately perpendicular to the leakage magnetic fluxes generated from the inductor L, the active component embedded substrate 2 can make it as difficult as possible for the feedback wiring pattern 32F to be affected by the leakage magnetic fluxes generated from inductor L.

As described above, the feedback wiring pattern 32F is formed on the second wiring layer 32 which is spaced from the inductor L. Moreover, the feedback wiring pattern 32F is not only disposed at a position distant from the inductor L but is also formed within the mounting area A7 of the IC chip 7 in the second wiring layer 32 and disposed under the mounted IC chip 7. Therefore, the IC chip 7 functions as a medium (shielding medium, shielding layer) that blocks the leakage magnetic fluxes generated from the inductor L. With this configuration, it is possible to suppress or block superimposition of noise on the feedback wiring pattern 32F which is a feedback signal line vulnerable to the leakage magnetic fluxes from the inductor L and to stabilize the feedback signal.

The feedback wiring pattern 32F may be a narrow wiring pattern capable of carrying a small amount of current since it is a wiring formed to monitor the smoothed output voltage. Moreover, the current carried by the feedback wiring pattern 32F formed in such a manner flows from the output voltage via-conductors 92Vo, 93Vo, and 93Vo which are at one end thereof to the feedback terminal 74 which is at the other end thereof. This current flows in a direction opposite to the direction of the current of the inductor L flowing on the substrate. Therefore, since a magnetic field (demagnetization field) of the opposite direction to the magnetic field generated from the inductor L is generated in the feedback wiring pattern 32F, it is possible to decrease the leakage magnetic fluxes generated from the inductor L to a sizeable amount.

Figure 17:
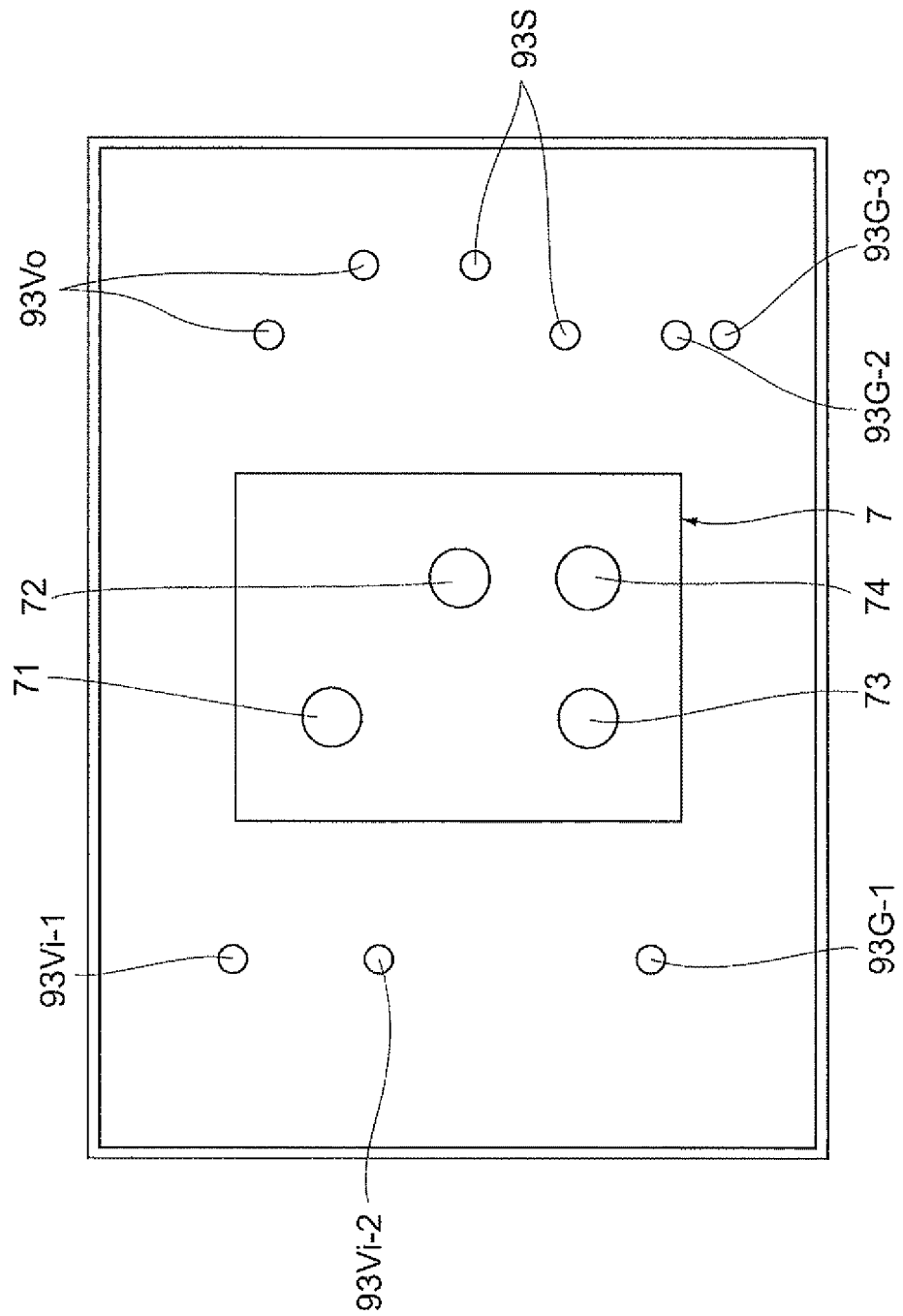
FIG. 17 is a structure diagram of the active component embedded substrate 2 when the ends of terminals 71 to 74 of an IC chip 7 are seen in a plan view from the ground side along the line III-III shown in FIG. 14.

FIG. 17 is a structure diagram (III-III cross-sectional view) of the active component embedded substrate 2 when the ends of the terminals 71 to 74 of the IC chip 7 are seen in a plan view from the ground side along the line III-III shown in FIG. 14. In the third insulating layer 43, the IC chip 7 is embedded, and the various terminals 71 to 74 of the IC chip 7 and the various via-conductors 93 (subscripts are omitted) connected to the third wiring layer 33 are formed. These via-conductors 93 are formed at one end of the IC chip 7 and are provided approximately right above the via-conductors 93 which are formed in the second wiring layer 32. The IC chip 7 is mounted inside the third insulating layer 43 so that the various terminals 71 to 74 are disposed on a side (ground side) spaced further apart from the input-side capacitor Cin, the output-side capacitor Cout, and the inductor L.

Figure 18:
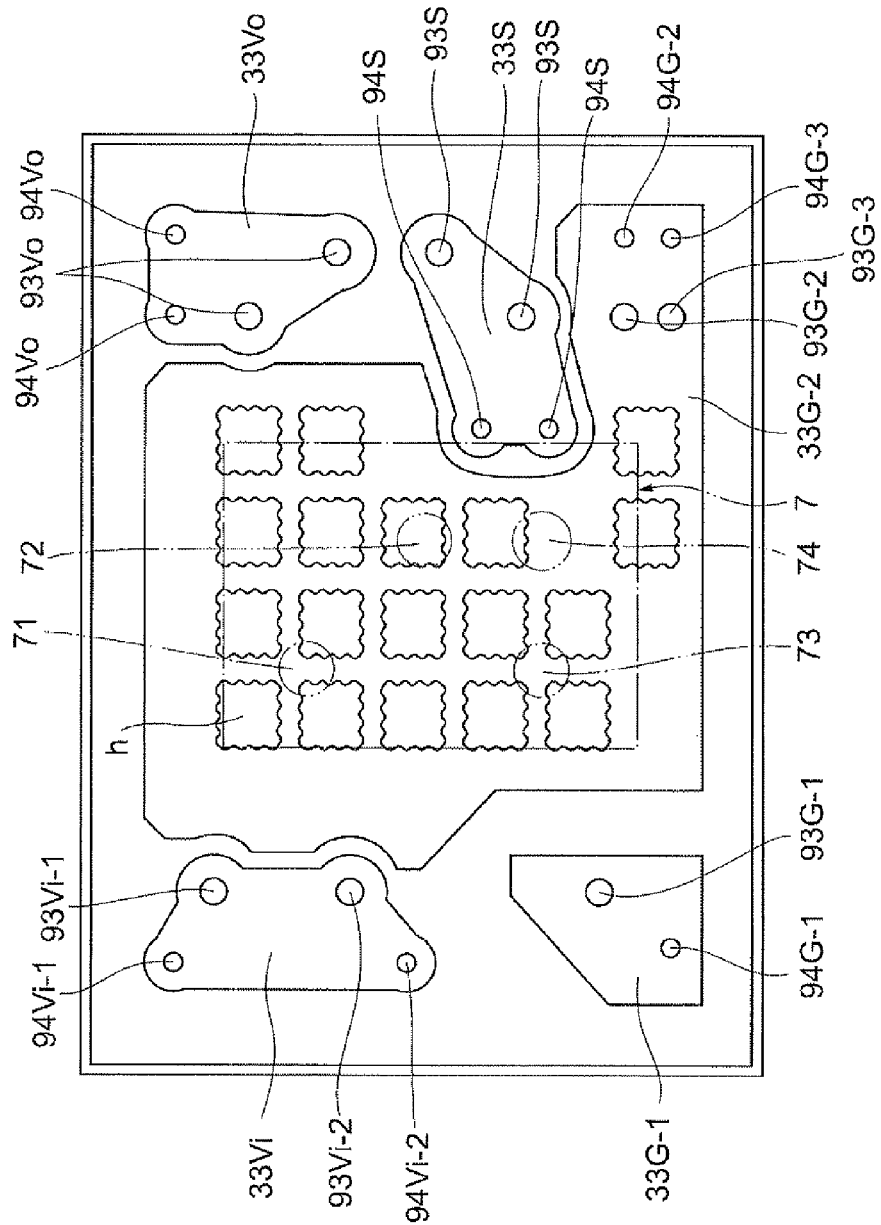
FIG. 18 is a wiring structure diagram when a third wiring layer 33 is seen in a plan view from the ground side along the line IV-IV shown in FIG. 14.

FIG. 18 is a wiring structure diagram (IV-IV cross-sectional view) when the third wiring layer 33 is seen in a plan view from the ground side along the line IV-IV shown in FIG. 14. In the third wiring layer 33, an input voltage wiring pattern 33Vi, an input-side ground wiring pattern 33G-1, an output-side ground wiring pattern 33G-2, a switching wiring pattern 33S, and an output voltage wiring pattern 33Vo are formed.

The input voltage wiring pattern 33Vi is integrally connected to the four input voltage via-conductors 93Vi-1, 93Vi-2, 94Vi-1, and 94Vi-2 which are provided in the third wiring layer 33. These four input voltage via-conductors 93Vi-1, 93Vi-2, 94Vi-1, and 94Vi-2 are formed on the circuit in such a way that two input voltage via-conductors 93Vi-1 and 93Vi-2 are connected in parallel and two input voltage via-conductors 94Vi-1 and 94Vi-2 are connected in parallel. The equivalent resistances of the input voltage via-conductors 93Vi-1 and 93Vi-2 are preferably higher than the equivalent resistances of the input voltage via-conductors 94Vi-1 and 94Vi-2. The input voltage wiring pattern 33Vi corresponds to wirings on the circuit, which connect the input voltage via-conductors 93Vi-1 and 93Vi-2 and the input voltage via-conductors 94Vi-1 and 94Vi-2 in parallel, respectively, and wirings on the circuit, which connect these parallel conductor groups in series.

The wiring pattern 33Vi is formed in the third wiring layer 33 so as to be integrated with the via-conductors 93Vi-1, 93Vi-2, 94Vi-1, and 94Vi-2 so that the via-conductors 94Vi-1 and 94Vi-2 are electrically connected in a relatively low-impedance state (short state). By doing so, at least a part of a wiring that connects the input voltage terminal 21 to which the input voltage is input and the input-side capacitor Cin and at least a part of a wiring that connects the input-side capacitor Cin and the IC chip 7 can be integrally formed as the same wiring. Therefore, it is possible to effectively prevent problems such as backward flow of current which can occur in a configuration in which the four input voltage via-conductors 93Vi-1, 93Vi-2, 94Vi-1, and 94Vi-2 are connected in series on the circuit, and the input-side capacitor Cin is connected between the two input voltage via-conductors 94Vi-1 and 94Vi-2.

By forming the input voltage via-conductors in such a manner, the wiring between the two input voltage via-conductors 93Vi-1 and 93Vi-2 can be divided on the circuit. Therefore, the input-side current is prevented from flowing up to the input voltage terminal 71 without passing through the input-side capacitor Cin. As a result, it is possible to prevent the backward flow of current resulting from a decrease of the input voltage. Moreover, the wiring to which the input voltage terminal 21 and the input-side capacitor Cin are connected and the wiring to which the input voltage terminal 71 and the input-side capacitor Cin are connected are shorted in the third wiring layer 33 that is different from the layer in which the IC chip 7 and the input voltage terminal 71 are formed. Therefore, it is possible to decrease the influence of fluctuations of the input voltage caused by the switching operation of the control circuit C to a negligible extent. Furthermore, since the two via-conductors 94Vi-1 and 94Vi-2 are provided so as to be integrally connected to the wiring pattern 33Vi so that the two via-conductors 94Vi-1 and 94Vi-2 are connected in parallel on the circuit, it is possible to decrease wiring impedance.

In the third wiring layer 33, the input-side ground wiring pattern 33G-1 and the output-side ground wiring pattern 33G-2 are formed separately. The ground wiring pattern 33G-1 is an input-side ground layer which is formed on the outer side in relation to the mounting area A7 of the IC chip 7 mounted under the third wiring layer 33. In this embodiment, the ground wiring pattern 33G-1 is formed to be integrated with the ground via-conductor 93G-1 connected to the second wiring layer 32 and a ground via-conductor 94G-1 connected to the fourth wiring layer 34.

On the other hand, the output-side ground wiring pattern 33G-2 is an output-side ground layer which is formed on the outer side in relation to the mounting area A7 of the IC chip 7 mounted under the third wiring layer 33. In this embodiment, the output-side ground wiring pattern 33G-2 is formed so as to cover approximately the entire region of the mounting area (packaging area) of the inductor L, excluding a region on which the input voltage wiring pattern 33Vi, the switching wiring pattern 33S, and the output voltage wiring pattern 33Vo are formed.

As described above, the output-side ground wiring pattern 33G-2 enables all the output-side ground lines to be shared, thus effectively decreasing the parasitic components included in the respective elements. As a result, the high-frequency noise is attenuated and output to the output side. Moreover, since the output-side ground wiring pattern 33G-2 is formed so as to cover the mounting area A7 of the IC chip 7 and the mounting area of the inductor L, the output-side ground wiring pattern 33G-2 also functions as an excellent electromagnetic shield.

A plurality of small holes h (see FIG. 18) is formed at predetermined intervals in the output-side ground wiring pattern 33G-2 so that an unevenness is formed on the surface thereof. Since the plurality of small holes h is formed, the area of the conductor layer of the output-side ground wiring pattern 33G-2 is increased (widened) compared to a case where no small hole h is formed. The ground wiring pattern 33G-2 can function as a more effective heat sink. In this way, it is possible to enhance the property of dissipating heat which can be generated in the IC chip 7 performing a high-speed switching operation, for example. That is, it is possible to decrease thermal impedance. Thus, it is possible to more reliably prevent the occurrence of problems such as malfunctions of the IC chip 7 resulting from the accumulation of a high degree of heat or an increase in the thermal budget (amount of heat input).

Referring to FIG. 2, the input-side capacitor Cin is connected to the ground at one position (one point) through the series via-resistors 93G-1 and 94G-1, whereas the output-side capacitor Cout is connected to the ground through a plurality of via-resistors 93G-2, 93G-3, 94G-2, and 94G-3. Moreover, the output-side via-conductors 94G-2 and 94G-3 connecting the third and fourth wiring layers 33 and 34 are formed in a greater number than the via-conductor 94G-1 which is formed in the input-side ground layer 33G-1. Furthermore, the series via-resistors 93G-2 and 94G-2 and the series via-resistors 93G-3 and 94G-3 are connected in parallel on the circuit, and the via-resistors 93G-2, 93G-3, 94G-2, and 94G-3 which are the parallel resistor groups are connected to the ground. In the drawing, the via-resistors 93G-2 and 93G-3 correspond to Rvia23_total, the via-resistors 94G-2 and 94G-3 correspond to Rvia34_total, and these via-resistors are connected in series.

As described above, the output-side capacitor Cout is connected to the output-side ground wiring pattern 33G-2 through a plurality of via-resistors Rvia34_total on the output side. The ground wiring pattern 33G-2 is connected to the ground, to which the output side is connected, through Rvia23_total and the ground wiring patterns 32G formed in the second wiring layer 32. Therefore, it is possible to further decrease electrical impedance between the output-side circuit and the ground to which the output side is connected.

In the related-art configuration, as shown in FIG. 2, when a ground layer 33'G is formed over a wide area of the third wiring layer 33 differently from this embodiment, the influence of electromagnetic noise resulting from the leakage magnetic fluxes generated from the surface of the inductor L can be suppressed or blocked greatly. However, since the ground to which the input side is connected is electrically connected to the ground to which the output side is connected, it is very difficult to prevent high-frequency noise which can propagate towards the output side.

In contrast, according to the DC-DC converter 1 of the invention, the input-side ground wiring pattern 33G-1 and the output-side ground wiring pattern 33G-2 are formed separately in the third wiring layer 33. Therefore, the ground to which the input side is connected and the ground to which the output side is connected can be connected in an electrically high-impedance state. Accordingly, it is possible to reliably prevent the high-frequency noise generated on the input side from propagating towards the output side.

Since the output-side ground wiring pattern 33G-2 is formed over a wide area so as to cover the IC chip 7, the influence of electromagnetic noise resulting from the leakage magnetic fluxes generated from the surface of the inductor L can be suppressed or blocked greatly. In addition, it is also possible to prevent mutual interference between various signal lines formed in the second wiring layer 32 and suppress the occurrence of noise which can be easily generated during the switching control of the control circuit C.

The output-side ground wiring pattern 33G-2 is preferably formed between the input voltage wiring pattern 33Vi and the output voltage wiring pattern 33Vo. By forming the wiring patterns in such a manner, the input-side signal lines and the output-side signal lines formed on the third wiring layer 33 can be divided by the ground layer. Therefore, it is possible to prevent mutual interference between the two kinds of signal lines and to further stabilize the operation of the active component embedded substrate 2.

FIG. 19 is a wiring structure diagram (V-V cross-sectional view) when the fourth wiring layer 34 is seen in a plan view from the ground side along the line V-V shown in FIG. 14. The fourth wiring layer 34 is made up of an input-side input voltage wiring pattern 34Vi, an input-side ground wiring pattern 34G-1, an output-side ground wiring pattern 34G-2, a switching wiring pattern 34S, and an output voltage wiring pattern 34Vo. These wiring patterns 34Vi, 34G-1, 34G-2, 34S, and 34Vo are connected to the input voltage via-conductors 94Vi-1 and 94Vi-2, the input-side ground via-conductors 94G-1, the output-side ground via-conductors 94G-2 and 94G-3, the switching via-conductor 94S, and the output voltage via-conductors 94Vo and 94Vo, respectively.

As described above, referring to FIG. 2, the input side is connected to the ground at one position (one point) through the series via-resistors 93G-1 and 94G-1. In the fourth wiring layer 34, the output-side via-conductors 94G-2 and 94G-3 are formed in a greater number than the via-conductor 94G-1 which is formed on the input-side ground layer 34G-1.

Moreover, electrode pads 61 to 66 are provided on the wiring patterns 34Vi, 34G-1, 34G-2, 34S, and 34Vo, respectively. The respective electrode pads 61 to 66 are formed within the regions of the respective wiring patterns 34Vi, 34G-1, 34G-2, 34S, and 34Vo so as to be disposed on the outer side in relation to the boundary of a region in which the inductor L, the input-side capacitor Cin, or the output-side capacitor Cout is mounted. In addition, the inductor L is mounted on the electrode pads 61 and 62, the input-side capacitor Cin is mounted on the electrode pads 63 and 64, and the output-side capacitor Cout is mounted on the electrode pads 65 and 66. In this way, the inductor L and the capacitors Cin and Cout are mounted on the DC-DC converter 1.

As described above, the invention is not limited to the embodiments described above, but can be modified appropriately in various ways as described above within a range without departing from the spirit thereof.

As described above, the voltage converter according to the invention can effectively cause high-frequency noise generated on the input side to be trapped in a circuit loop on the input side, thus securely suppressing the high-frequency noise from propagating towards the output side. As a result, it is possible to reliably prevent malfunctions of an electronic circuit in the voltage converter and to stably maintain an accurate operation thereof. Therefore, the voltage converter according to the invention can be widely and effectively used in various devices such as instruments, apparatuses, and systems having active components, particularly those requiring miniaturization and high performance, and the production and manufacturing thereof.

According to the voltage converter of the invention, a predetermined ground potential connected to an input-side circuit or wiring including the input-side capacitor and a predetermined ground potential connected to an output-side circuit or wiring including the output-side capacitor are connected in an electrically high-impedance state. With this configuration, it is possible to effectively cause high-frequency noise generated on the input side to be trapped in a circuit loop on the input side. Therefore, it is possible to securely suppress the high-frequency noise from propagating towards the output side. Accordingly, it is possible to reliably prevent malfunctions of an electronic circuit in the voltage converter and to stably maintain the accurate operation thereof.

What is claimed is:

1. A voltage converter comprising:

a substrate having an active component embedded therein;

an input-side capacitor and an output-side capacitor which are mounted on the substrate and connected to a predetermined ground potential and which include a ground-side terminal; and a first conductor layer and a second conductor layer which are formed so as to interpose the active component therebetween and connected to a predetermined ground potential, wherein:

the first conductor layer includes an input-side conductor layer which is connected to a ground-side terminal of the input-side capacitor, and an output-side conductor layer which is provided separately from the input-side conductor layer and connected to a ground-side terminal of the output-side capacitor;

the second conductor layer is connected to terminals of the active component;

a ground-side terminal of the input-side capacitor is connected to the second conductor layer through the input-side conductor layer; and a ground-side terminal of the output-side capacitor is connected to the second conductor layer through the output-side conductor layer.

2. The voltage converter according to claim 1, wherein the active component is disposed so that the terminals of the active component face a side opposite to the input-side capacitor.

3. The voltage converter according to claim 1, wherein the output-side conductor layer has an unevenness on a surface thereof and is formed so as to cover the active component.

4. The voltage converter according to claim 1, wherein the output-side conductor layer has a plurality of holes which is formed at predetermined intervals.

5. The voltage converter according to claim 1, wherein the ground-side terminal of the input-side capacitor is connected to the predetermined ground potential at one position.

6. The voltage converter according to claim 1, wherein the ground-side terminal of the output-side capacitor is connected to the predetermined ground potential at a plurality of positions.

* * * * *